US012770791B2

(12) United States Patent
Berolini

(10) Patent No.: US 12,770,791 B2
(45) Date of Patent: Oct. 20, 2026

(54) MULTILAYER CAPACITOR

(71) Applicant: KYOCERA AVX Components Corporation, Fountain Inn, SC (US)

(72) Inventor: Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 187 days.

(21) Appl. No.: 18/494,794

(22) Filed: Oct. 26, 2023

(65) Prior Publication Data

US 2024/0145172 A1 May 2, 2024

Related U.S. Application Data

(60) Provisional application No. 63/420,722, filed on Oct. 31, 2022.

(51) Int. Cl.
*H01G 4/232* (2006.01)
*H01G 4/012* (2006.01)
(Continued)

(52) U.S. Cl.
CPC ........... *H01G 4/2325* (2013.01); *H01G 4/012* (2013.01); *H01G 4/30* (2013.01); *H05K 1/181* (2013.01);
(Continued)

(58) Field of Classification Search
CPC ........ H01G 4/2325; H01G 4/012; H01G 4/30; H10D 1/68; H05K 1/181; H05K 2201/10015
See application file for complete search history.

(56) References Cited

U.S. PATENT DOCUMENTS 4,831,494 A 5/1989 Arnold et al.
5,583,738 A 12/1996 Kohno
(Continued)

FOREIGN PATENT DOCUMENTS

EP 2689455 B1 8/2016
EP 2614521 B1 1/2018
(Continued)

OTHER PUBLICATIONS

AVX, LGA Low Inductance Capacitors 0204/0306 Land Grid Array, p. 85-86.
(Continued)

*Primary Examiner* — Michael P Mcfadden
(74) *Attorney, Agent, or Firm* — Dority & Manning, P.A.

(57) ABSTRACT

The present invention is directed to a multilayer capacitor, a circuit board containing the multilayer capacitor, and an integrated circuit package containing the multilayer capacitor. A multilayer capacitor includes a body having top, bottom, opposing side, and opposing end surfaces and containing alternating dielectric layers and internal electrode layers. Each internal electrode layer includes at least one lead tab extending from each of a top edge and a bottom edge of a main body of the internal electrode layer. The capacitor also includes external terminals electrically connected to the internal electrode layers and arranged in a linear fashion on at least one of the top surface or the bottom surface. The external terminals are spaced apart from the side edges of the body such that only dielectric material is disposed between the external terminals and the side edges of the body.

36 Claims, 13 Drawing Sheets

(51) Int. Cl.
*H01G 4/30* (2006.01)
*H05K 1/181* (2026.01)
*H10D 1/68* (2025.01)

(52) U.S. Cl.
CPC ..... *H05K 2201/10015* (2013.01); *H10D 1/68* (2025.01)

(56) References Cited

U.S. PATENT DOCUMENTS 5,880,925 A 3/1999 DuPre et al.
6,034,864 A 3/2000 Naito et al.
6,075,285 A 6/2000 Taylor et al.
6,243,253 B1 6/2001 DuPre et al.
6,292,351 B1 9/2001 Ahiko et al.
6,407,907 B1 6/2002 Ahiko et al.
6,430,059 B1 8/2002 Hung et al.
6,456,561 B2 9/2002 Maeda
6,459,561 B1 10/2002 Galvagni et al.
6,477,032 B2 11/2002 Makl, Jr.
6,496,355 B1 12/2002 Galvagni et al.
6,532,143 B2 3/2003 Figueroa et al.
6,594,136 B2 7/2003 Kuroda et al.
6,606,237 B1 8/2003 Naito et al.
6,664,628 B2 12/2003 Khandros et al.
6,752,152 B2 6/2004 Gale et al.
6,757,152 B2 6/2004 Galvagni et al.
6,795,294 B2 9/2004 Kuroda et al.
6,795,295 B2 9/2004 Murakami et al.
6,816,356 B2 11/2004 Devoe et al.
6,829,134 B2 12/2004 Yamauchi et al.
6,898,070 B2 5/2005 Korony et al.
6,909,593 B2 6/2005 Kuroda et al.
6,950,300 B2 9/2005 Sutardja
6,960,366 B2 11/2005 Ritter et al.
6,970,362 B1 11/2005 Chakravorty
7,068,490 B2 6/2006 Prymak
7,149,072 B2 12/2006 Lee et al.
7,170,737 B2 1/2007 MacNeal et al.
7,177,137 B2 2/2007 Ritter et al.
7,230,816 B2 6/2007 Sutardja
7,251,116 B2 7/2007 Roy
7,280,342 B1 10/2007 Randall et al.
7,310,217 B2 12/2007 Takashima et al.
7,317,622 B2 1/2008 Li
7,327,554 B2 2/2008 Otsuka et al.
7,365,957 B2 4/2008 Togashi et al.
7,394,645 B2 7/2008 Takahashi
7,414,857 B2 8/2008 Ritter et al.
7,417,857 B2 8/2008 Rondier et al.
7,463,474 B2 12/2008 Ritter et al.
7,545,623 B2 6/2009 Randall et al.
7,573,698 B2 8/2009 Eggerding et al.
7,576,968 B2 8/2009 Ritter et al.
7,633,739 B2 12/2009 Devoe
7,662,430 B2 2/2010 Satou
7,667,950 B2 2/2010 Togashi
7,672,112 B2 3/2010 Hattori et al.
7,697,262 B2 4/2010 Ritter et al.
7,701,695 B2 4/2010 Sutardja
7,715,171 B2 5/2010 Nakano et al.
7,724,496 B2 5/2010 Eggerding et al.
7,724,498 B2 5/2010 Mosley et al.
7,732,296 B2 6/2010 Park et al.
7,733,628 B2 6/2010 Lee et al.
7,737,563 B2 6/2010 Su et al.
7,791,192 B1 9/2010 Joshi et al.
7,897,433 B2 3/2011 Su et al.
7,958,627 B2 6/2011 Randall et al.
7,961,453 B2 6/2011 Lee et al.
7,990,677 B2 8/2011 Lee et al.
8,004,820 B2 8/2011 Itamura
8,045,319 B2 10/2011 Ritter et al.
8,054,607 B2 11/2011 Lee et al.
8,084,297 B1 12/2011 Joshi et al.
8,111,524 B2 2/2012 Randall et al.
8,159,813 B2 4/2012 Lee et al.
8,193,039 B2 6/2012 Su et al.
8,203,198 B2 6/2012 Shioga et al.
8,238,116 B2 8/2012 Eggerding et al.
8,267,718 B2 9/2012 Straka et al.
8,293,636 B2 10/2012 Schulze et al.
8,299,633 B2 10/2012 Su
8,338,961 B2 12/2012 Su et al.
8,339,797 B2 12/2012 Maeda et al.
8,394,672 B2 3/2013 Su et al.
8,446,705 B2 5/2013 Ritter et al.
8,451,014 B2 5/2013 Black et al.
8,456,791 B2 6/2013 Jones et al.
8,472,190 B2 6/2013 Refai-Ahmed et al.
8,574,965 B2 11/2013 Refai-Ahmed et al.
8,624,404 B1 1/2014 Su et al.
8,647,974 B2 2/2014 Topacio et al.
8,691,626 B2 4/2014 Su et al.
8,704,353 B2 4/2014 Su et al.
8,717,774 B2 5/2014 Randall et al.
8,723,314 B2 5/2014 Su et al.
8,730,646 B2 5/2014 Kawasaki et al.
8,759,962 B2 6/2014 Su
8,796,842 B2 8/2014 Refai-Ahmed et al.
8,816,474 B2 8/2014 Hanke et al.
8,866,276 B2 10/2014 Su et al.
8,917,491 B2 12/2014 Masuda et al.
9,142,468 B2 9/2015 Bower et al.
9,177,724 B2 11/2015 Abe et al.
9,214,283 B2 12/2015 Togashi
9,263,186 B2 2/2016 Li et al.
9,330,849 B2 5/2016 Gong et al.
9,343,236 B2 5/2016 Kim et al.
9,385,055 B2 7/2016 Refai-Ahmed et al.
9,425,121 B2 8/2016 Tsai et al.
9,426,891 B2 8/2016 Tsai et al.
9,437,561 B2 9/2016 Black et al.
9,449,907 B2 9/2016 Fu et al.
9,472,343 B2 10/2016 Ahn et al.
9,478,474 B2 10/2016 Chen et al.
9,524,826 B2 12/2016 Choi
9,530,564 B2 12/2016 Yao
9,613,755 B2 4/2017 Oh et al.
9,627,281 B2 4/2017 Prejean et al.
9,660,008 B2 5/2017 Bower et al.
9,666,366 B2 5/2017 Ritter et al.
9,787,437 B2 10/2017 Feng et al.
9,793,239 B2 10/2017 Su et al.
9,806,014 B2 10/2017 Alfano et al.
9,837,215 B2 12/2017 Lee et al.
9,837,352 B2 12/2017 Chang et al.
9,847,173 B2 12/2017 Taniguchi et al.
9,847,299 B2 12/2017 Teshima et al.
9,960,146 B1 5/2018 Lin
9,997,467 B2 6/2018 Shao et al.
10,014,112 B2 7/2018 Azuma et al.
10,083,795 B2 9/2018 Itamura
10,109,576 B2 10/2018 Tanaka
10,128,048 B2 11/2018 Park et al.
10,135,416 B2 11/2018 Chong et al.
10,163,735 B2 12/2018 Bower et al.
10,204,737 B2 2/2019 Ritter et al.
10,229,789 B2 3/2019 Park et al.
10,304,628 B2 5/2019 Hwang et al.
10,306,770 B2 5/2019 Hattori
10,366,835 B2 7/2019 Ritter et al.
10,395,837 B2 8/2019 Chong et al.
10,418,180 B2 9/2019 Kageyama et al.
10,418,331 B2 9/2019 Bower
10,424,438 B2 9/2019 Martinex et al.
10,468,363 B2 11/2019 Prevatte et al.
10,490,540 B2 11/2019 Yu et al.
10,522,352 B2 12/2019 Delacruz et al.
10,593,618 B2 3/2020 Cheah et al.
10,621,387 B2 4/2020 Chhabra et al.
10,672,563 B2 6/2020 Cain
10,707,145 B2 7/2020 Bultitude et al.
10,756,025 B2 8/2020 Lee et al.
10,832,912 B2 11/2020 Delacruz et al.

(56) References Cited

U.S. PATENT DOCUMENTS

| | | | | |
|---|---|---|---|---|
| 10,910,157 | B2 | 2/2021 | Kim | |
| 10,939,563 | B2 | 3/2021 | Silvano De Sousa | |
| 10,943,735 | B2 | 3/2021 | Horn et al. | |
| 10,943,869 | B2 | 3/2021 | Zhai et al. | |
| 10,998,261 | B2 | 5/2021 | Kong et al. | |
| 11,017,949 | B2 | 5/2021 | Kato et al. | |
| 11,121,074 | B2 | 9/2021 | Cheah et al. | |
| 11,139,115 | B2 | 10/2021 | Cain | |
| 11,239,174 | B2 | 2/2022 | Lu | |
| 11,257,785 | B2 | 2/2022 | Zhang et al. | |
| 11,276,660 | B2 | 3/2022 | Lee | |
| 11,289,333 | B2 | 3/2022 | Delacruz et al. | |
| 11,296,043 | B2 | 4/2022 | Kung et al. | |
| 11,302,644 | B2 | 4/2022 | Lu | |
| 11,302,647 | B2 | 4/2022 | Chen et al. | |
| 11,309,295 | B2 | 4/2022 | Huang et al. | |
| 11,322,428 | B2 | 5/2022 | Yen et al. | |
| 11,342,272 | B2 | 5/2022 | Hsu et al. | |
| 11,342,282 | B2 | 5/2022 | Shih et al. | |
| 11,348,885 | B2 | 5/2022 | Kung et al. | |
| 11,362,026 | B2 | 6/2022 | Kuo et al. | |
| 11,362,036 | B2 | 6/2022 | Liu | |
| 11,373,809 | B2 | 6/2022 | Berolini et al. | |
| 11,393,775 | B2 | 7/2022 | Hsieh et al. | |
| 11,404,386 | B2 | 8/2022 | Cheng et al. | |
| 11,437,192 | B2 | 9/2022 | Kim et al. | |
| 11,437,247 | B2 | 9/2022 | Essig et al. | |
| 11,443,997 | B2 | 9/2022 | Cho et al. | |
| 11,469,186 | B2 | 10/2022 | Tien et al. | |
| 11,469,212 | B2 | 10/2022 | Black et al. | |
| 11,495,531 | B2 | 11/2022 | Kim et al. | |
| 11,508,668 | B2 | 11/2022 | Kung et al. | |
| 11,538,760 | B2 | 12/2022 | Lu | |
| 11,538,778 | B2 | 12/2022 | Fang | |
| 11,545,406 | B2 | 1/2023 | Yen et al. | |
| 11,545,426 | B2 | 1/2023 | Chou | |
| 11,562,978 | B2 | 1/2023 | Pon et al. | |
| 11,621,217 | B2 | 4/2023 | Shih et al. | |
| 11,626,363 | B2 | 4/2023 | Haba et al. | |
| 11,636,978 | B2 | 4/2023 | Cain | |
| 11,637,055 | B2 | 4/2023 | Tai et al. | |
| 11,676,912 | B2 | 6/2023 | Huang et al. | |
| 11,682,656 | B2 | 6/2023 | Yen et al. | |
| 11,699,682 | B2 | 7/2023 | Lu | |
| 11,710,675 | B2 | 7/2023 | Fang | |
| 11,721,488 | B2 | 8/2023 | Horn et al. | |
| 11,721,652 | B2 | 8/2023 | Lu | |
| 11,721,679 | B2 | 8/2023 | Jung et al. | |
| 11,728,294 | B2 | 8/2023 | Collins et al. | |
| 11,735,533 | B2 | 8/2023 | Mallik et al. | |
| 11,756,896 | B2 | 9/2023 | Kung et al. | |
| 11,756,948 | B2 | 9/2023 | Sounart et al. | |
| 11,764,179 | B2 | 9/2023 | Lin | |
| 11,784,152 | B2 | 10/2023 | Chu et al. | |
| 11,823,906 | B2 | 11/2023 | DeLaCruz et al. | |
| 11,837,405 | B2 | 12/2023 | Berolini et al. | |
| 11,837,557 | B2 | 12/2023 | Yang et al. | |
| 11,848,160 | B2 | 12/2023 | Kobayashi et al. | |
| 11,848,296 | B2 | 12/2023 | Yen et al. | |
| 11,862,525 | B2 | 1/2024 | Lin et al. | |
| 11,887,967 | B2 | 1/2024 | Wu et al. | |
| 11,997,888 | B2 | 5/2024 | Chen et al. | |
| 12,027,467 | B2 | 7/2024 | Cho et al. | |
| 12,033,982 | B2 | 7/2024 | Zhai | |
| 12,074,118 | B2 | 8/2024 | Huang et al. | |
| 12,100,697 | B2 | 9/2024 | Lin et al. | |
| 12,148,679 | B2 | 11/2024 | Pi | |
| 12,170,241 | B2 | 12/2024 | Kuo et al. | |
| 12,176,297 | B2 | 12/2024 | Hsieh et al. | |
| 12,506,116 | B2 | 12/2025 | Lin et al. | |
| 2004/0090732 | A1* | 5/2004 | Ritter | H01C 7/008 361/306.1 |
| 2004/0125580 | A1 | 7/2004 | Chung et al. | |
| 2004/0223290 | A1* | 11/2004 | Sutardja | H01G 4/40 361/306.3 |
| 2005/0231890 | A1* | 10/2005 | Prymak | H01L 23/50 257/E23.079 |
| 2007/0035014 | A1 | 2/2007 | Fung | |
| 2007/0096254 | A1 | 5/2007 | Ritter et al. | |
| 2008/0001253 | A1* | 1/2008 | Mosley | H01G 4/232 257/532 |
| 2008/0123247 | A1* | 5/2008 | Randall | H01G 4/35 361/306.2 |
| 2008/0186650 | A1 | 8/2008 | Beker | |
| 2009/0244807 | A1 | 10/2009 | Lee et al. | |
| 2010/0188799 | A1* | 7/2010 | Galvagni | H01G 4/30 361/306.3 |
| 2013/0002388 | A1 | 1/2013 | Kim et al. | |
| 2013/0094157 | A1 | 4/2013 | Guiliano | |
| 2013/0201615 | A1 | 8/2013 | Arnold et al. | |
| 2013/0256913 | A1 | 10/2013 | Black et al. | |
| 2014/0293501 | A1 | 10/2014 | Jeong | |
| 2015/0014037 | A1 | 1/2015 | Ahn et al. | |
| 2015/0016016 | A1 | 1/2015 | Lee et al. | |
| 2015/0243438 | A1 | 8/2015 | Ahn et al. | |
| 2015/0294791 | A1 | 10/2015 | Hwang et al. | |
| 2016/0126013 | A1 | 5/2016 | Park et al. | |
| 2016/0196921 | A1* | 7/2016 | Oh | H01G 4/008 29/25.42 |
| 2016/0240317 | A1 | 8/2016 | Ro et al. | |
| 2017/0012029 | A1 | 1/2017 | Lambert et al. | |
| 2018/0158772 | A1 | 6/2018 | Tanaka | |
| 2018/0330880 | A1* | 11/2018 | Cain | H01G 4/1227 |
| 2018/0330881 | A1* | 11/2018 | Cain | H01G 4/012 |
| 2019/0080982 | A1 | 3/2019 | Bultitude et al. | |
| 2020/0075571 | A1 | 3/2020 | Chen et al. | |
| 2022/0157709 | A1 | 5/2022 | Shih et al. | |
| 2023/0019800 | A1 | 1/2023 | Cain | |
| 2023/0307389 | A1 | 9/2023 | Kuo | |
| 2024/0128247 | A1 | 4/2024 | Marin et al. | |
| 2024/0145169 | A1 | 5/2024 | Berolini | |
| 2024/0145176 | A1 | 5/2024 | Berolini | |
| 2024/0145449 | A1 | 5/2024 | Desclos | |
| 2024/0145451 | A1 | 5/2024 | Desclos | |
| 2024/0145452 | A1 | 5/2024 | Desclos | |
| 2024/0145528 | A1 | 5/2024 | Desclos | |
| 2024/0145529 | A1 | 5/2024 | Desclos | |
| 2024/0265305 | A1 | 8/2024 | DeLaCruz et al. | |
| 2024/0363505 | A1 | 10/2024 | Kuo et al. | |
| 2024/0429157 | A1 | 12/2024 | Desclos | |
| 2024/0429182 | A1 | 12/2024 | Desclos | |

FOREIGN PATENT DOCUMENTS

| | | | |
|---|---|---|---|
| JP | 2004304159 | A | 10/2004 |
| JP | 2005039005 | A | 2/2005 |
| JP | 2005150283 | A | 6/2005 |
| JP | 2008022017 | | 1/2008 |
| JP | 2008085054 | A | 4/2008 |
| JP | 2009081183 | A | 4/2009 |
| JP | 2010183025 | A | 8/2010 |
| JP | 2010199269 | A | 9/2010 |
| JP | 2018520507 | A | 7/2018 |
| KR | 20050089493 | A | 9/2005 |
| KR | 20070081537 | A | 8/2007 |
| KR | 101539884 | | 7/2015 |
| KR | 102387826 | B1 | 4/2022 |
| KR | 102393946 | B1 | 5/2022 |
| WO | WO 2024/097034 | | 5/2024 |

OTHER PUBLICATIONS

AVX, Low Inductance Capacitors, p. 1-12, http://www.avxcorp.com.

Brown, Land Grid Array (LGA) Low Inductance Capacitor Advantages in Military and Aerospace Applications, 5 pages.

Cantlebary, AVX Corporation, Technical Information, LICA (Low Inductance Capacitor Array Flip-Chip Application Notes, 14 pages.

Kyocera AVX, Low Inductance Capacitors, Surface Mount Ceramic Capacitor Products, p. 75-78.

Lau, "Chiplet Heterogeneous Integration" Semiconductor Advanced Packaging, 2021, pp. 413-439.

(56) References Cited

OTHER PUBLICATIONS

International Search Report and Written Opinion for PCT/US2023/035667 dated Feb. 6, 2024, 10 pages.

* cited by examiner

MULTILAYER CAPACITOR

RELATED APPLICATION

The present application is based upon and claims priority to U.S. Provisional Patent Application Ser. No. 63/420,722, having a filing date of Oct. 31, 2022, which is incorporated herein by reference.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics.

SUMMARY OF THE SUBJECT MATTER

In accordance with one embodiment of the present invention, a multilayer capacitor is disclosed. The multilayer capacitor comprises a body having a top surface, a bottom surface opposing the top surface, a pair of side surfaces opposing one another along a lateral direction, and a pair of end surfaces opposing one another along a longitudinal direction. The body also has side edges defining lateral boundaries of the top and bottom surfaces and including a first top side edge, a second top side edge, a first bottom side edge, and a second bottom side edge each extending along the longitudinal direction between the pair of end surfaces. The first top side edge and the second top side edge oppose each other along the lateral direction, and the first bottom side edge and the second bottom side edge oppose each other along the lateral direction. The body contains alternating dielectric layers and internal electrode layers. The internal electrode layers include first internal electrode layers and second internal electrode layers. Each internal electrode layer includes a main body having a top edge, a bottom edge opposite the top edge, and two side edges extending between the top edge and the bottom edge and at least one lead tab extending from the top edge of the main body of the internal electrode layer and at least one lead tab extending from the bottom edge of the main body of the internal electrode layer. The multilayer capacitor also has external terminals, including a first external terminal disposed on at least one of the top surface or the bottom surface and electrically connected to the first internal electrode layers and a second external terminal disposed on at least one of the top surface or the bottom surface and electrically connected to the second internal electrode layers. The external terminals are arranged in a linear fashion on at least one of the top surface or the bottom surface of the body and are spaced apart from the side edges of the body such that only dielectric material is disposed between the external terminals and the side edges of the body.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

Figure 1A:
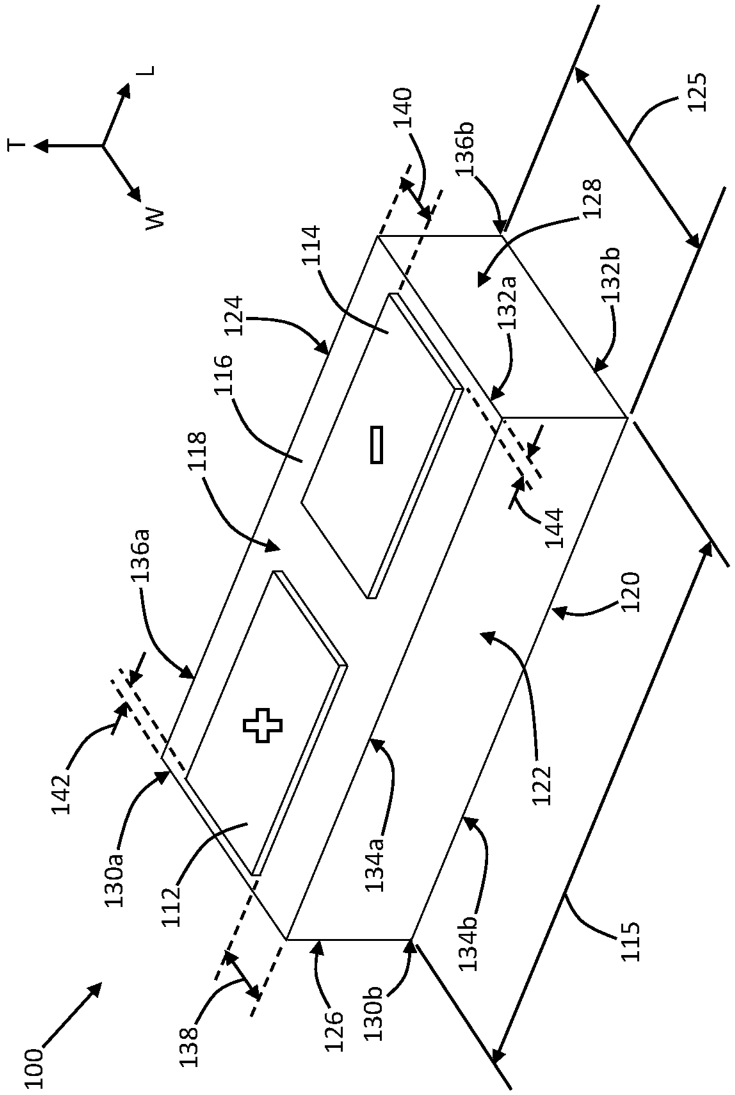
FIG. 1A illustrates a generally top and sides external perspective view of one embodiment of a capacitor including two external terminals in accordance with the present invention.

It is to be understood by one of ordinary skill in the art that the present discussion is a description of exemplary embodiments only and is not intended as limiting the broader aspects of the present invention.

Generally speaking, the present invention is directed to a multilayer capacitor. The multilayer capacitor (or simply, capacitor) contains a body having alternating dielectric layers and internal electrode layers. The body at least has a pair of end surfaces and a pair of side surfaces. External terminals are formed on the body of the capacitor that are spaced apart from at least the pair of side surfaces of the body. The external terminals are arranged in a linear fashion in a single dimension, such that only dielectric material is disposed between at least two sides of each external terminal and adjacent edges of the capacitor surface on which the external terminal is disposed.

The particular arrangement of the elements of the capacitor can provide several advantages. For instance, the capacitor of the present invention may be mounted onto a circuit board as a surface mount capacitor and may provide a smaller footprint on the circuit board. This may in turn also allow for a reduction in size of a circuit board.

Additionally, in certain applications, it is desirable to maintain as low an inductance (i.e., parasitic inductance) as possible. Employing the capacitor of the present invention allows for a substantial reduction in inductance. In particular, minimizing the distance or path for a ground connection can assist in reducing the inductance. In general, employing the capacitor of the present invention can allow for at least one order of magnitude reduction in inductance in comparison to employing a plurality of individual multilayer ceramic capacitors. For instance, employing the capacitor of the present invention may result in an inductance on the order of picohenries or even femtohenries in comparison to capacitors of the prior art which exhibit inductance of greater magnitudes. In general, the inductance may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more. Minimizing such inductance can contribute to good performance, in particular good decoupling performance, especially under high-speed transient conditions.

In addition, the capacitor may provide a desired capacitance. In particular, the capacitance may be 1,000 μF or less, such as 750 μF or less, such as 500 μF or less, such as 250 μF or less, such as 100 μF or less, such as 50 μF or less, such as 25 μF or less, such as 20 μF or less, such as 15 μF or less, such as 10 μF or less, such as 5 μF or less, such as 2.5 μF or less, such as 1 μF or less, such as 0.75 μF or less, such as 0.5 μF or less. The capacitance may be 1 pF or more, such as 10 pF or more, such as 25 pF or more, such as 50 pF or more, such as 100 pF or more, such as 250 pF or more, such as 500 pF or more, such as 750 pF or more, such as 900 pF or more, such as 1 μF or more, such as 2 μF or more, such as 3 μF or more, such as 5 μF or more, such as 8 μF or more, such as 10 μF or more. The capacitance may be measured using general techniques as known in the art.

Further, the capacitor may provide a desired resistance. In particular, the resistance may be 100 mOhm or less, such as 75 mOhm or less, such as 50 mOhm or less, such as 40 mOhm or less, such as 30 mOhm or less, such as 25 mOhm or less, such as 20 mOhm or less, such as 15 mOhm or less, such as 10 mOhm or less, such as 5 mOhm or less. The resistance may be 0.01 mOhm or more, such as 0.1 mOhm or more, such as 0.25 mOhm or more, such as 0.5 mOhm or more, such as 1 mOhm or more, such as 1.5 mOhm or more, such as 2 mOhm or more, such as 5 mOhm or more, such as 10 mOhm or more. The resistance may be measured using general techniques as known in the art.

As indicated above, the present invention includes a multilayer capacitor that includes a body having a top surface and a bottom surface opposite the top surface. The body of the capacitor also includes at least one side surface, in particular at least two side surfaces, that extend between the top surface and the bottom surface. The capacitor may include at least one end surface, in particular at least two end surfaces, that extend between the top surface and the bottom surface. In general, the side surfaces extend in a longitudinal or length (L) direction and have a generally longer dimension than the end surfaces, which extend in a lateral or width (W) direction and have a generally shorter dimension. In one embodiment, the capacitor includes at least six total surfaces (e.g., one top, one bottom, two sides, and two ends). For instance, the capacitor may have a parallelepiped shape, such as a rectangular parallelepiped shape.

In addition, the capacitor may have a desired height. For instance, the height may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 600 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

The capacitor may have a desired length. For instance, the length may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 1,500 microns or more, such as 2,000 microns or more, such as 2,500 microns or more, such as 3,000 microns or more, such as 3,500 microns or more, such as 4,000 microns or more. The length may be 10,000 microns or less, such as 8,000 microns or less, such as 6,000 microns or less, such as 5,000 microns or less, such as 4,000 microns or less, such as 3,000 microns or less, such as 2,500 microns or less, such as 2,000 microns or less, such as 1,000 microns or less, such as 750 microns or less, such as 600 microns or less, such as 500 microns or less, such as 450 microns or less.

The capacitor may also have a desired width. For instance, the width may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 750 microns or more, such as 1,000 microns or more, such as 1,500 microns or more, such as 2,000 microns or more, such as 2,500 microns or more, such as 3,000 microns or more. The width may be 5,000 microns or less, such as 4,000 microns or less, such as 3,000 microns or less, such as 2,500 microns or less, such as 2,000 microns or less, such as 1,500 microns or less, such as 1,000 microns or less, such as 750 microns or less, such as 600 microns or less, such as 500 microns or less, such as 450 microns or less.

In general, the multilayer capacitor contains a set of alternating dielectric layers and internal electrode layers. Generally, the capacitor includes at least one set of alternating dielectric layers and internal electrode layers. The capacitor may also contain a second set of alternating dielectric layers and internal electrode layers. In this regard, the capacitor may include at least two, such as at least three, such as at least four sets of alternating dielectric layers and internal electrode layers. However, it should be understood that the present invention may include any number of sets of alternating dielectric layers and internal electrode layers and is not necessarily limited. In addition, the respective sets of alternating dielectric layers and internal electrode layers may be separated from an adjacent set by a certain distance. For instance, that distance is greater than the thickness of an individual dielectric layer in the set. In particular, the distance may be at least two, such as at least 3, such as at least 5, such as at least 10 times the thickness of a dielectric layer in the set.

The set(s) of alternating dielectric layers and internal electrode layers may form at least part of the main body of the capacitor. By arranging the dielectric layers and the internal electrode layers in a stacked or laminated configuration, the capacitor may be referred to as a multilayer capacitor and in particular a multilayer ceramic capacitor, for instance when the dielectric layers comprise a ceramic.

The capacitor also includes external terminals electrically connected to the internal electrode layers. The external terminals are formed on at least a top surface of the capacitor and a bottom surface of the capacitor opposing the top surface of the capacitor. In some embodiments, the external terminals may include a first end external terminal and a second end external terminal and one or both of the first and second end external terminals also may be formed on the respective end surface adjacent the respective end external terminal.

The alternating dielectric layers and internal electrode layers include dielectric layers alternately arranged with internal electrode layers. In particular, the internal electrode layers include first internal electrode layers and second internal electrode layers interleaved in an opposed and spaced apart relation with a dielectric layer located between each internal electrode layer.

In general, the thickness of the dielectric layers and internal electrode layers is not limited and can be any thickness as desired depending on the performance characteristics. For instance, the thickness of the internal electrode layers can be, but is not limited to, about 500 nm or greater, such as about 1 μm or greater, such as about 2 μm or greater to about 10 μm or less, such as about 5 μm or less, such as about 4 μm or less, such as about 3 μm or less, such as about 2 μm or less. For instance, the internal electrode layers may have a thickness of from about 1 μm to about 2 μm.

In addition, the present invention is not necessarily limited by the number of internal electrode layers per set of alternating dielectric layers and internal electrode layers or in the entire capacitor. For instance, each set may include 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

The internal electrode layers have a top edge and a bottom edge opposite the top edge. The internal electrode layers also have two side edges that extend between the top edge and the bottom edge. In one embodiment, the side edges, top edge, and bottom edge define a main body of the internal electrode layers. In general, the main body of the internal electrode layers may have a rectangular configuration or shape.

In general, the top edge and the bottom edge may have the same dimension (e.g., length—L direction). The side edges may have the same dimension (e.g., height—T direction). In general, the side edges may have a dimension (e.g., height—T direction) that is shorter than a dimension (e.g., length—L direction) of the top edge and/or bottom edge. In this regard, the height of a side edge of the internal electrode layer as it extends between the top and bottom surfaces of the capacitor may be less than the length of the top edge and/or bottom edge of the internal electrode layers as it extends between end surfaces of the capacitor. In other words, the internal electrode layers may have a top edge and/or a bottom edge of greater dimension than the side edges of a lesser dimension. In this regard, the "short" sides of the layers may register with the height direction of the capacitor.

The internal electrode layers have lead tabs extending from the main body of the respective internal electrode layer. The lead tabs extend from a top edge and a bottom edge. In other words, the internal electrode layers may have lead tabs extending from the "long" sides or edges of the internal electrode layers. The lead tabs may extend to an edge of a dielectric layer and/or a surface of the capacitor. For instance, when in a stacked configuration, a leading edge of the lead tab may extend to an edge of a dielectric layer. Such leading edge may be used to form the external terminals. In addition, the top edge and the bottom edge of a layer may have at least one lead tab, such as at least two lead tabs, such as at least three lead tabs, such as at least four lead tabs extending therefrom.

Each top edge and bottom edge of the internal electrode layers may have an equal number of lead tabs extending therefrom. For instance, each top edge and bottom edge may have at least one lead tab extending therefrom. In another embodiment, each top edge and bottom edge may have at least two lead tabs extending therefrom. However, it should be understood that the present invention may include any number of lead tabs extending from the internal electrode layers and is not necessarily limited.

In one embodiment, at least one lead tab extends from a top edge and a bottom edge of the main body of the internal electrode layer, and an edge of the lead tab aligns with a side edge of the main body of the internal electrode layer. For instance, at least one lateral edge (i.e., edge registering in a height direction) of the lead tabs may be substantially aligned with a respective side edge of the main body of the internal electrode layer. In this regard, at least one lead tab may not be offset from the side edge of the internal electrode layer.

However, in some embodiments, the at least one lead tab may be offset from a side edge of the internal electrode layer. For example, an edge of a respective lead tab is parallel with but spaced apart from a side edge of the main body of the internal electrode layer along the length or L direction. For instance, at least one lateral edge (i.e., edge registering in a height direction) of the lead tabs may be substantially parallel with a respective side edge of the main body of the internal electrode layer but offset from the side edge of the internal electrode layer along the length of the main body of the internal electrode layer.

Additionally, or alternatively, when more than one lead tab may be present along an edge, a respective lead tab may extend from an inner portion of a top edge and a bottom edge of the main body of the internal electrode layer. In this regard, the lead tab may not extend immediately from a side edge of an internal electrode layer. In other words, the lead tab may be offset from a side edge of the internal electrode layer, e.g., in the length or L direction. The offset may be such that it is offset and positioned between the side edges of the internal electrode layer, in particular at a position that is at least 50% of the length of the internal electrode layer (e.g., past the center of the internal electrode layer).

The lead tabs extending from a top edge of a respective internal electrode layer and a bottom edge of the same internal electrode layer may be offset the same distance from a side edge. In this regard, at least one lateral edge (i.e., edge registering in a height direction) of the lead tabs may be substantially aligned. In one embodiment, both lateral edges of the respective lead tabs may be substantially aligned.

Similarly, the length (i.e., extending in the longitudinal direction from an end surface to another end surface) of a lead tab extending from the top edge may be the same as the length of a corresponding lead tab extending from the bottom edge.

The length of a respective lead tab may be 0.3 mm or more, such as 0.4 mm or more, such as 0.5 mm or more, such as 0.6 mm or more, such as 0.7 mm or more. The length of the respective lead tab may be 1.1 or less, such as 0.9 or less, such as 0.8 or less, such as 0.7 or less, such as 0.6 or less, such as 0.5 or less. When more than one lead tab is present along an edge, each lead tab may have the same length.

In another embodiment, each lead tab may have a different length. For instance, for an internal electrode layer have more than one lead tab extending from the top edge or bottom edge, a lead tab substantially aligned with the side edge of the internal electrode layer may have a length greater than the lead tab offset from the side edges of the internal electrode layer. In this regard, the ratio of the length of the lead tab aligned with the side edge of the internal electrode layer to the length of the lead tab offset from the side edges of the internal electrode layer may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

By substantially aligned, it is meant that the offset from a side edge of one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge of a corresponding lateral edge of a first lead tab and/or second lead tab on a bottom edge.

When the dielectric layers and internal electrode layers are stacked together as described herein, aligned lead tabs form what may be referred to as a column of lead tabs or electrode tabs. The distance between adjacent exposed lead tabs of the internal electrode layers in a given column may be specifically designed to ensure guided formation of terminations. Such distance between exposed lead tabs of the internal electrode layers in a given column may be about 10 microns or less, such as about 8 microns or less, such as about 5 microns or less, such as about 4 microns or less, such as about 2 microns or less, such as about 1.5 microns or less, such as about 1 micron or less. The distance may be about 0.25 microns or more, such as about 0.5 microns or more, such as about 1 micron or more, such as about 1.5 microns or more, such as about 2 microns or more, such as about 3 microns or more. However, it should be understood that such distance may not necessarily be limited.

Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization is about four times the distance between adjacent exposed electrode tabs in a particular stack. However, such distance may vary depending on the desired capacitance performance and circuit board configuration.

The distance may be 0.1 mm or more, such as 0.2 mm or more, such as 0.3 mm or more, such as 0.4 mm or more, such as 0.5 mm or more, such as 0.6 mm or more. The distance may be 1.5 mm or less, such as 1.3 mm or less, such as 1 mm or less, such as 0.9 mm or less, such as 0.7 mm or less, such as 0.6 mm or less, such as 0.5 mm or less, such as 0.4 mm or less. Such distance may be determined based on the centerpoint of each lead tab in one embodiment. In another embodiment, such distance may be based on the distance between adjacent lateral edges of the lead tabs. In addition, such distance may correspond to the separation distance of the balls on a ball grid array.

A lead tab of a first internal electrode layer and a lead tab of a second internal electrode layer within a set of alternating dielectric layers and internal electrode layers are offset from each other in the longitudinal or length direction. That is, the lead tabs of respective internal electrode layers may be symmetrically offset a certain distance from a centerline (e.g., longitudinal centerline or about a vertical line) of the internal electrode layers and/or dielectric layers. That is, the lead tabs of respective internal electrode layers may be symmetrically offset about a vertical line of the internal electrode layers and/or dielectric layers. Regardless, a gap region is formed between the lead tabs of respective internal electrode layers.

In addition, the internal electrode layers, regardless of the number of lead tabs extending therefrom, may be symmetrical in a given direction. For instance, the lead tabs may be symmetrical about a horizontal line (i.e., a line extending from the center of one side edge to the center of the other side edge of the internal electrode layer) through the center of the main body of the internal electrode layer.

Further, as indicated herein, each internal electrode layer includes at least two side edges. When stacked to form the body of the capacitor, such side edges of the alternating internal electrode layers may not be substantially aligned with one another. For instance, the side edges may be offset from one another. Moreover, in at least some embodiments, the side edges may be offset from the side surfaces of the body of the capacitor.

The capacitor of the present invention also includes external terminals on the top surface and the bottom surface of the body of the capacitor. The external terminals are spaced apart from the side surfaces of the body of the capacitor such that only dielectric material is disposed between the external terminals and the side surfaces of the body. In some embodiments, the capacitor also includes external terminals on opposing end surfaces of the body of the capacitor, but in other embodiments, in addition to being spaced apart from the side surfaces, the external terminals are spaced apart from at least one of the opposing end surfaces such that only dielectric material is disposed between the external terminals and the at least one end surface.

The external terminals include at least one first polarity terminal and at least one second and opposite polarity terminal. The capacitor may include at least one, such as at least two, such as at least four, such as at least six, such as at least eight first polarity terminals and/or second and opposite polarity terminals on a top surface of the body of the capacitor. Additionally, the capacitor may include the aforementioned amounts of terminals on a bottom surface of the body of the capacitor.

The capacitor may include an equal number of first polarity terminals and/or second polarity terminals on the top surface and the bottom surface. The number of first polarity terminals may equal the number of second and opposite polarity terminals on the top surface. The number of first polarity terminals may equal the number of second and opposite polarity terminals on the bottom surface. The total number of terminals present on a top surface of the capacitor may equal to the total number of terminals present on a bottom surface of the capacitor. The total number of first polarity terminals present on a top surface and a bottom surface of the capacitor may equal the total number of second and opposite polarity terminals present on a top surface and a bottom surface of the capacitor.

In general, the like polarity terminals on the bottom surface of the capacitor that correspond to a particular set of alternating dielectric layers and internal electrode layers are electrically connected to the like polarity terminals on the top surface of the capacitor. The like polarity terminals located on a top surface and a bottom surface of a capacitor may not be interdigitated. In this regard, corresponding like polarity terminals on a top and a bottom surface may not be offset by a terminal position but may instead be positioned directly above or below another like polarity terminal on the opposite top or bottom surface. In other words, corresponding like polarity terminals that correspond to a particular set of lead tabs may be substantially aligned. By substantially aligned, it is meant that the offset from a side edge of one lateral edge of a polarity terminal on a top surface is within +/−10%, such as within +/−5%, such as within +/−4%, such as within +/−3%, such as within +/−2%, such as within +/−1%, such as within +/−0.5% of the offset from a side edge of a corresponding polarity terminal on a bottom surface.

In general, the pitch (i.e., nominal distance between the centers, also referred to as center-to-center spacing) of the external terminals may be dictated by a particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

A ratio of a length of the capacitor body to the pitch may be 1.1 or more, such as 2 or more, 5 or more, 10 or more, 20 or more, 100 or more, or 500 or more. For example, the ratio of the length of the capacitor body to the pitch may be within a range of 1.1 to 1,000, such as within a range of 2 to 500, within a range of 5 to 100, or within a range of 10 to 50.

As indicated above, the extension of a leading edge of a lead tab can assist in the formation of the external terminals. In this regard, the pitch between a lead tab on a first internal electrode layer and a lead tab on a second internal electrode layer may be the same as mentioned above. That is, the pitch between a lead tab on a first internal electrode layer and a lead tab on a second internal electrode layer may be substantially the same as the pitch between the corresponding external terminals for which the lead tabs are utilized in forming.

In addition, the external terminals may be positioned similar to the configuration of a ball-grid array. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, the external terminals may be provided in a single row having a number of columns, which may be referred to in a row×columns designation as a 1×n configuration of external terminals, where n is the number of columns. For example, the external terminals may be provided such that they exist in a single row and at least two columns. For instance, the external terminals may be presented in at least two columns, such as at least three columns, such as at least four columns. The number of columns can be dictated by the number of different columnar tabs of the internal electrodes.

Further, the length of an external terminal extending in the longitudinal or length L direction along the top surface may be the same as the length of a corresponding external terminal extending along the bottom surface. The length of an external terminal may be measured from one terminal end surface to another terminal end surface, which are opposed to one another in the longitudinal direction.

The length of an external terminal may be 0.3 mm or more, such as 0.4 mm or more, such as 0.5 mm or more, such as 0.6 mm or more, such as 0.7 mm or more. The length of the external terminal may be 1.1 mm or less, such as 0.9 mm or less, such as 0.8 mm or less, such as 0.7 mm or less, such as 0.6 mm or less, such as 0.5 mm or less. When more than one external terminal is present along a surface, each external terminal may have the same length. Further, the length of the external terminal may be less than the length of the capacitor, such as 50% or less, such as 40% or less, such as 30% or less, such as 25% or less, such as 20% or less, such as 15% or less the length of the capacitor.

In another embodiment, each external terminal may have a different length. For instance, the external terminal adjacent an end surface may have a length greater than the external terminal offset from the end surface. In this regard, the ratio of the length of the external terminal adjacent an end surface to the length of the external terminal offset from the end surface may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

Further, the width of an external terminal extending in the lateral or width W direction may be same on the top surface and the bottom surface. The width of an external terminal may be measured from one terminal side surface to another terminal side surface, which are opposed to one another in the lateral direction.

The width of an external terminal may be 0.3 mm or more, such as 0.4 mm or more, such as 0.5 mm or more, such as 0.6 mm or more, such as 0.7 mm or more. The width of the external terminal may be 1.1 mm or less, such as 0.9 mm or less, such as 0.8 mm or less, such as 0.7 mm or less, such as 0.6 mm or less, such as 0.5 mm or less. When more than one external terminal is present along a surface, each external terminal may have the same width. Further, the width of the external terminal may be less than the width of the capacitor.

Moreover, the external terminals may be spaced apart from each other, as well as the sides and/or ends of the capacitor, such that dielectric material is disposed between adjacent external terminals. The external terminals may include a first end external terminal disposed adjacent or closest to a first end surface of the capacitor body and a second end external terminal disposed adjacent or closest to a second end surface of the capacitor body. The first end external terminal and the second end external terminal may be spaced apart from one another in the longitudinal direction by an end external terminal spacing distance. A ratio of a length of the capacitor body to the end external terminal spacing distance may be 1.1 or more, such as 2 or more, 5 or more, 10 or more, 20 or more, 100 or more, or 500 or more. For example, the ratio of the length of the capacitor body to the end external terminal spacing distance may be within a range of 1.1 to 1,000, such as within a range of 2 to 500, within a range of 5 to 100, or within a range of 10 to 50.

The adjacent external terminals may also be spaced apart from one another in the longitudinal direction on the top surface of the capacitor by an adjacent external terminal spacing distance, e.g., between adjacent lateral sides of the external terminals. For example, for a pair of adjacent external terminals having lateral sides facing the other of the pair of adjacent external terminals, the lateral side of one external terminal of the pair is spaced apart from the lateral side of the other external terminal of the pair by the adjacent external terminal spacing distance. A ratio of the body length of the capacitor to the adjacent external terminal spacing distance may be 1.1 or more, such as 2 or more, 5 or more, 10 or more, 20 or more, 100 or more, or 500 or more. For example, the ratio of the body length of the capacitor to the adjacent external terminal spacing distance may be within a range of 1.1 to 1,000, such as within a range of 2 to 500, within a range of 5 to 100, or within a range of 10 to 50.

The capacitor of the present invention can be further described according to the embodiments as illustrated in FIGS. 1A through 1D, 2A through 2D, and 3A through 3C.

FIG. 1A illustrates a capacitor 100 in a 1 by 2 configuration. That is, the capacitor 100 includes two external terminals arranged in a linear fashion in a single dimension on a top surface and a bottom surface of the capacitor. In the depicted embodiment, the capacitor 100 includes external terminals arranged in a linear fashion or a single row along a longitudinal direction L, which may be referred to as a linear terminal arrangement.

Figure 1B:
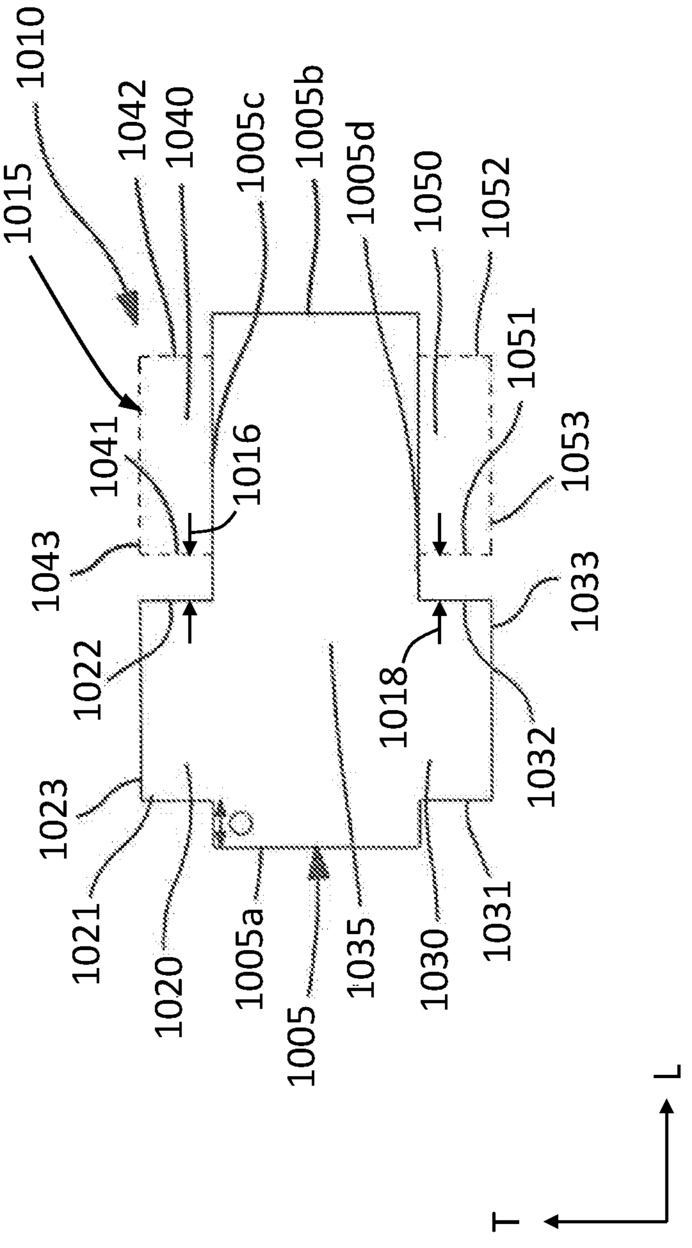
FIG. 1B illustrates a side view of the internal electrode layers of the capacitor of FIG. 1A.
Figure 1C:
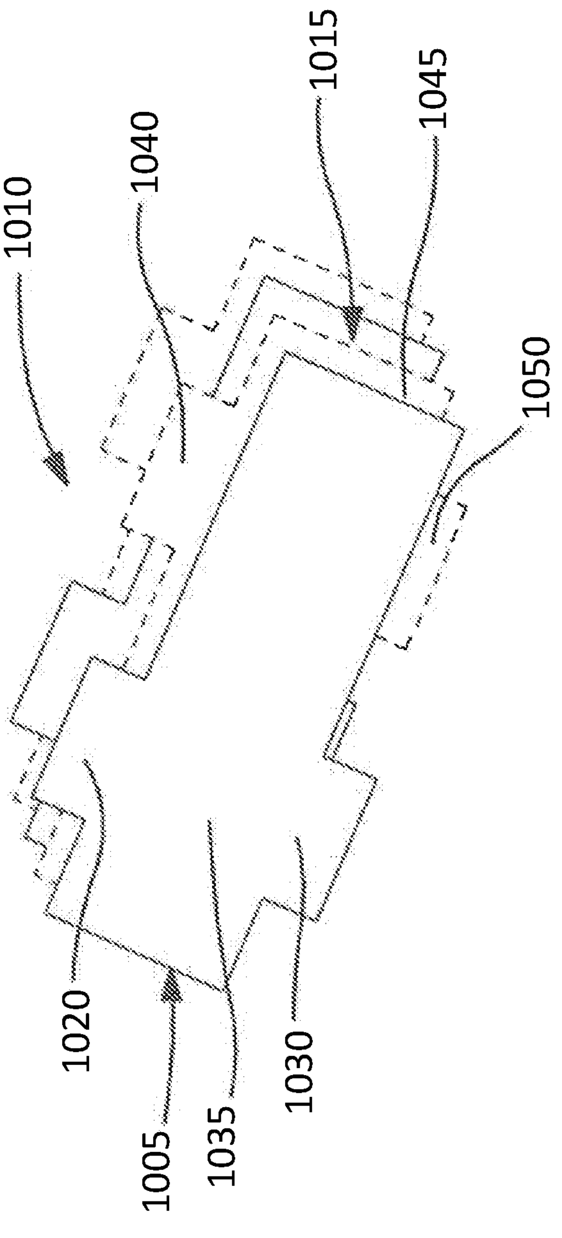
FIG. 1C illustrates a three-dimensional top and sides external perspective view of the internal electrode layers of the capacitor of FIGS. 1A and 1B.

In this regard, the capacitor 100 includes a body 116 having external terminals 112, 114, including a first external terminal 112 disposed on at least one of the top surface 118 or the bottom surface 120 and electrically connected to first internal electrode layers 1005 (FIGS. 1B, 1C) and a second external terminal 114 disposed on at least one of the top surface 118 or the bottom surface 120 and electrically connected to second internal electrode layers 1015 (FIGS. 1B, 1C). More particularly, in the depicted embodiment, the capacitor 100 includes a first external terminal 112 and a second external terminal 114 disposed on the top surface 118 of the body 116 and two corresponding external terminals 112, 114 (not shown) on the bottom surface 120 of the body 116, which may be referred to as a third external terminal 112 and a fourth external terminal 114.

The external terminals 112, 114 on the top surface 118 are electrically connected to the corresponding external terminals 112, 114 on the bottom surface 120. As such, as shown in FIG. 1A, the capacitor 100 includes at least one first polarity terminal and at least one second and opposite polarity terminal on the top surface 118, and although not shown, the bottom surface 120 also includes at least a first polarity terminal and a second and opposite polarity terminal. Moreover, the first and third external terminals 112 are electrically connected to first internal electrode layers 1005 (FIGS. 1B, 1C) and the second and fourth external terminals 114 are electrically connected to second internal electrode layers 1015 (FIGS. 1B, 1C).

The body 116 includes the top surface 118 and the bottom surface 120 opposing the top surface 118 along a height direction T. The body also includes a first side surface 122 extending between the top surface 118 and the bottom surface 120 along the height direction T and a second side surface 124 opposing the first side surface 122 along a lateral or width direction W and extending between the top surface 118 and the bottom surface 120. The body further includes a first end surface 126 extending between the top surface 118 and the bottom surface 120 along the height direction T and a second end surface 128 opposing the first end surface 126 along a longitudinal or length direction L and extending between the top surface 118 and the bottom surface 120. The body 116 has a body length 115 and a body width 125.

As further illustrated in FIG. 1A, the body 116 includes end edges 130, 132 defining longitudinal boundaries of the top and bottom surfaces 118, 120 and side edges 134, 136 defining lateral boundaries of the top and bottom surfaces 118, 120. For instance, the top surface 118 has a first top end edge 130*a* and a second top end edge 132*a* extending along the lateral direction W between the pair of side surfaces 122, 124. The first top end edge 130*a* and the second top end edge 132*a* oppose each other along the longitudinal direction L. The top surface 118 also has a first top side edge 134*a* and a second top side edge 136*a* extending along the longitudinal direction L between the pair of end surfaces 126, 128. The first top side edge 134*a* and the second top side edge 136*a* oppose each other along the lateral direction W. The top end edges 130*a*, 132*a* define a longitudinal boundary of the top surface 118, and the top side edges 134*a*, 136*a* define the lateral boundary of the top surface 118.

Similarly, the bottom surface 120 has a first bottom end edge 130*b* and a second bottom end edge 132*b* extending along the lateral direction W between the pair of side surfaces 122, 124. The first bottom end edge 130*b* and the second bottom end edge 132*b* oppose each other along the longitudinal direction L. The bottom surface 120 also has a first bottom side edge 134*b* and a second bottom side edge 136*b* extending along the longitudinal direction L between the pair of end surfaces 126, 128. The first bottom side edge 134*b* and the second bottom side edge 136*b* oppose each other along the lateral direction W. The bottom end edges 130*b*, 132*b* define a longitudinal boundary of the bottom surface 120, and the bottom side edges 134*b*, 136*b* define the lateral boundary of the bottom surface 120.

It will be appreciated that, although not shown in the figures, the bottom surface 120 may be configured similarly to the top surface 118. That is, the bottom surface 120 also may have a first end edge and a second end edge extending along the lateral direction W between the pair of side surfaces 122, 124 and opposing each other along the longitudinal direction L. The bottom surface 120 also may have a first side edge and a second side edge extending along the longitudinal direction L between the pair of end surfaces 126, 128 and opposing each other along the lateral direction W. The end edges and the side edges may define the longitudinal and lateral boundaries, respectively, of the bottom surface 120.

Figure 1D:
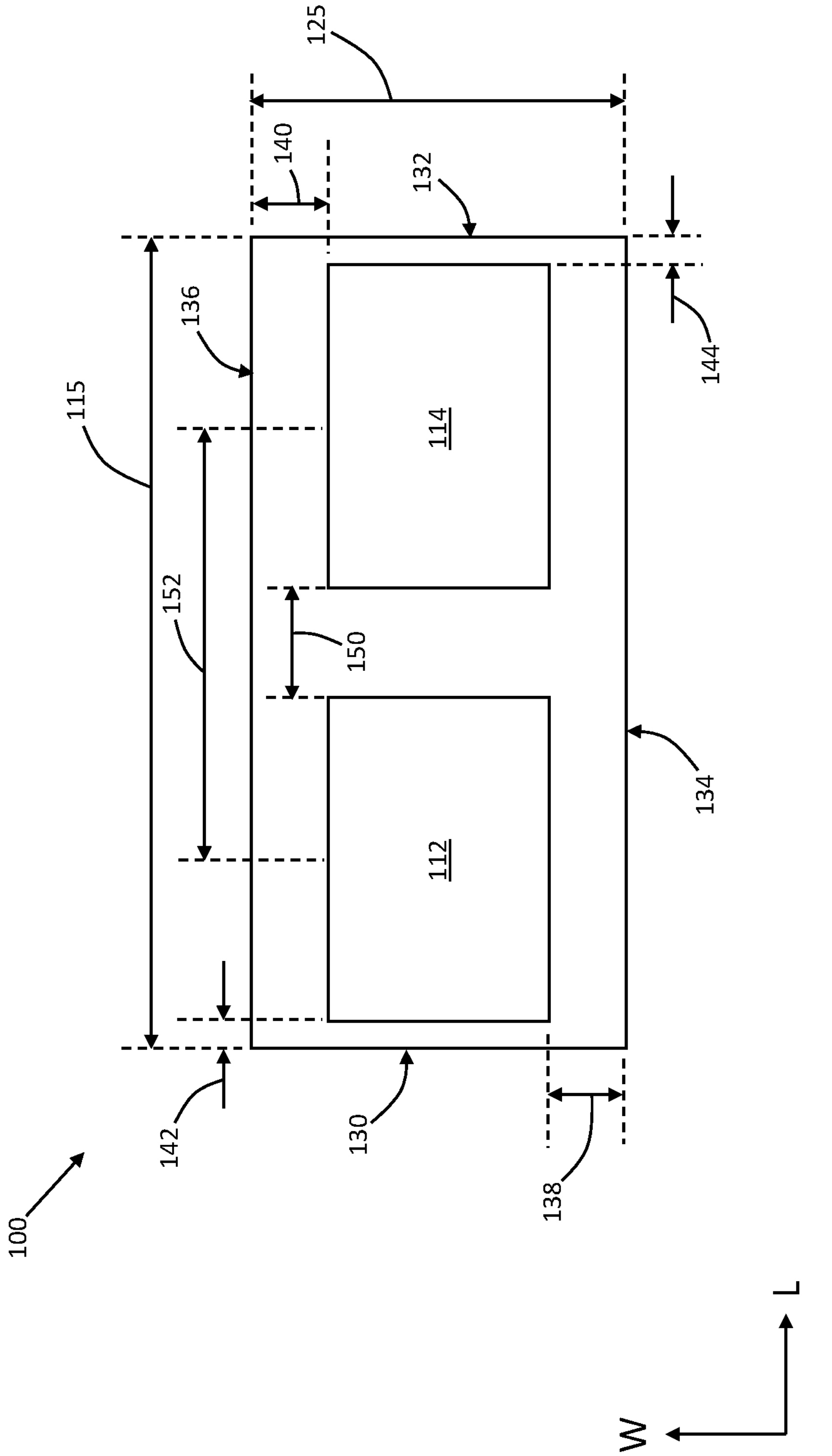
FIG. 1D illustrates a top external view of the capacitor of FIGS. 1A through 1C.

The external terminals 112, 114 of the capacitor 100 are offset from the sides and ends of the capacitor 100. As shown in FIGS. 1A and 1D, the external terminals 112, 114 are spaced apart from each of the first side edge 134 and the second side edge 136 of both the top surface 118 and the bottom surface 120 such that only dielectric material is disposed between the side edges 134, 136 and the external terminals 112, 114. For example, the external terminals 112, 114 are spaced apart from the first side edge 134*a* on the top surface 118 and the first side edge 134*b* on the bottom surface 120 to define a first edge gap 138 between the external terminals 112, 114 and each of the first side edges 134*a*, 134*b*. Further, the external terminals 112, 114 are spaced apart from the second side edge 136*a* on the top surface 118 and the second side edge 136*b* on the bottom surface 120 to define a second edge gap 140 between the external terminals 112, 114 and each of the second side edges 136*a*, 136*b*.

The edge gaps 138, 140 may be greater than the thickness of an individual layer, such as greater than an individual dielectric layer or an individual internal electrode layer 1010 (FIGS. 1B, 1C). For instance, each edge gap 138, 140 may be at least two times, such as at least three times, such as at least five times, such as at least ten times the thickness of an individual dielectric layer or an individual internal electrode layer. In some embodiments, the first edge gap 138 and the second edge gap 140 may be the same (e.g., for a given surface 118, 120, the external electrodes 112, 114 may be the same distance or equidistant from the respective first side edge 134 as the respective second side edge 136), but in other embodiments, the first edge gap 138 and the second edge gap 140 may be different (e.g., for a given surface 118, 120, the external electrodes 112, 114 may be closer to one of the respective first side edge 134 or the respective second side edge 136 than the other side edge of the respective surface 118, 120).

Similarly, the external terminals 112, 114 of the capacitor 100 are spaced apart from the end edges 130, 132 of the top and bottom surfaces 118, 120. As shown in FIGS. 1A and 1D, the external terminals 112, 114 are spaced apart from each of the first end edge 130 and the second end edge 132 of the top surface 118 and the bottom surface 120 to define a first end gap 142 between the external terminal 112 and the first end edges 130*a*, 130*b* and a second end gap 144 between the external terminal 114 and the second end edges 132*a*, 132*b*.

The end gaps 142, 144 may be greater than the thickness of an individual layer, such as greater than an individual dielectric layer or an individual internal electrode layer 1010 (FIGS. 1B, 1C). For instance, each end gap 142, 144 may be at least two times, such as at least three times, such as at least five times, such as at least ten times the thickness of an individual dielectric layer or an individual internal electrode layer. In some embodiments, the first end gap 142 and the second end gap 144 may be the same (e.g., for a given surface 118, 120, the external terminal 112 may be the same distance from the respective first end edge 130 as the external terminal 114 is from the respective second end edge 132), but in other embodiments, the first end gap 142 and the second end gap 144 may be different (e.g., for a given surface 118, 120, one of the external terminals 112, 114 may be closer to its adjacent end edge 130, 132 than the other external electrode 112, 114 is to its adjacent end edge 130, 132).

Referring to FIGS. 1A and 1B, the capacitor 100 of FIG. 1A includes external terminals 112, 114 and a set of alternating dielectric layers and internal electrode layers 1010. Referring particularly to FIG. 1B, the set of alternating dielectric layers and internal electrode layers 1010 includes internal electrode layers 1005, 1015 and dielectric layers (not shown) in an alternate arrangement.

In general, the internal electrode layers 1005, 1015 include at least one lead tab 1020, 1030, 1040, 1050 extending from a top edge and a bottom edge of a main body of the internal electrode layers. In general, the lead tabs 1020, 1030, 1040, 1050 of the internal electrode layers 1005, 1015 extend to the top surface and the bottom surface of the capacitor and assist in forming the external terminals 112, 114. In this regard, the lead tabs 1020, 1030, 1040, 1050 may be exposed on the top surface 118 and the bottom surface 120 of the capacitor and allow for connection between the main body of the internal electrode layers and the external terminals 112, 114. For instance, lead tabs 1020, 1030, 1040, 1050 may contain leading edges 1023, 1033, 1043, 1053 that extend to an edge of a dielectric layer and allow for formation of the external terminals 112, 114 on the top surface 118 and bottom surface 120.

As illustrated in FIGS. 1B and 1C, a first internal electrode layer 1005 includes one lead tab 1020 extending from the main body 1035 along a top edge 1005*c* and one lead tab 1020 extending from the main body 1035 along a bottom edge 1005*d*. A second internal electrode layer 1015 includes one lead tab 1040 extending from the main body 145 along a top edge and one lead tab 1050 extending from the main body 145 along a bottom edge.

The lead tabs 1020, 1030 on the top edge 1005*c* and the bottom edge 1005*d* of first internal electrode layer 1005 may be aligned in the vertical or height direction T. That is, a lateral edge 1021, 1022 of a first lead tab 1020 along a top edge 1005*c* may be aligned with a lateral edge 1031, 1032 of a first lead tab 1030 along a bottom edge 1005*d* opposite the top edge 1005*c*. In other words, a lateral edge 1021, 1022 of a first lead tab 1020 along a top edge 1005*c* may be offset (indicated by "O") from a side edge 1005*a-b* the same distance as a lateral edge 1031, 1032 of a first lead tab 1030 along a bottom edge 1005*d* opposite the top edge 1005*c*.

However, it should be understood that both lateral edges 1021, 1022 of the first lead tab 1020 along a top edge 1005*c* may be aligned with the lateral edges 1031, 1032 of a first lead tab 1030 along a bottom edge 1005*d* opposite the top edge 1005*c*. In other words, both lateral edges 1021, 1022 of a first lead tab 1020 along a top edge 1005*c* may be offset from a side edge 1005*a-b* the same distance as both lateral edges 1031, 1032 of a first lead tab 1030 along a bottom edge 1005*d* opposite the top edge 1005*c*.

Similarly, the lead tabs 1040, 1050 on the top edge and the bottom edge of second internal electrode layer 1015 may be aligned in the vertical direction. That is, a lateral edge 1041, 1042 of a first lead tab 1040 along a top edge may be aligned with a lateral edge 1051, 1052 of a first lead tab 1050 along a bottom edge opposite the top edge. In one embodiment, both lateral edges 1041, 1042 of the first lead tab 1040 along a top edge may be aligned with the lateral edges 1051, 1052 of a first lead tab 1050 along a bottom edge opposite the top edge. The relationship between lateral edges of a first lead tab on a top edge and a first lead tab on a bottom edge as mentioned with respect to internal electrode layer 1005 may also apply to internal electrode layer 1015.

With such arrangement, a tab gap 1016 may be formed between lead tab 1020 of the first internal electrode layer 1005 and lead tab 1040 of the second internal electrode layer 1015. Similarly, a tab gap 1018 may be formed between lead tab 1030 of the first internal electrode layer 1005 and lead tab 1050 of the second internal electrode layer 1015. The size of each respective tab gap 1016, 1018 may be substantially the same.

The lead tabs 1020 and 1040 may be arranged in parallel with lead tabs 1030 and 1050, respectively, extending from the internal electrode layers 1005 and 1015 such that the lead tabs extending from alternating electrode layers 1005 and 1015 may be aligned in a respective column. For instance, lead tabs 1020 and 1030 of internal electrode layer 1005 may be arranged in a respective stacked configuration while lead tabs 1040 and 1050 of internal electrode layer 1015 may be arranged in a respective stacked configuration.

It will be appreciated that lead tabs 1020 connect to external terminal 112 while lead tabs 1040 connect to external terminal 114. Accordingly, respective lead tabs 1020 will be interdigitated with respective lead tabs 1040 in a manner similar to external terminals 112 and 114. The interdigitated lead tabs can provide multiple, adjacent current injection points onto the associated main electrode portions.

Referring to FIG. 1D, a top view is provided of the top surface 118 of the capacitor 100. It will be appreciated that the bottom surface 120 may be configured substantially similar to the top surface 118 such that the description of the top surface 118 may likewise describe the bottom surface 120.

As depicted in FIG. 1D, the external terminals 112, 114 may be spaced apart from each other, as well as the sides and ends of the top surface 118 and bottom surface 120 of the capacitor 100. As one example, the external terminals 112, 114 may include a first end external terminal 112 disposed on the top surface 118 adjacent the first end surface 126 and first end edge 130*a* and a second end external terminal 114 disposed on the top surface 118 adjacent the second end surface 128 and second end edge 132*a*. The first end external terminal 112 and the second end external terminal 114 are spaced apart in the longitudinal direction L by an end external terminal spacing distance 150.

As previously described, the body 116 has a body length 115 in the longitudinal direction L. A ratio of the body length 115 the end external terminal spacing distance 150 is 1.1 or more. For example, the ratio of the body length 115 the end external terminal spacing distance 150 may be 1.1 or more, such as 2 or more, 5 or more, 10 or more, 20 or more, 100 or more, or 500 or more.

As further illustrated in FIG. 1D, a pitch 152 is defined between adjacent external terminals 112, 114. As previously described, the pitch 152 is the nominal distance between the centers of adjacent external terminals; the pitch 152 also may be referred to as center-to-center spacing of the external terminals. A ratio of the body length 115 the pitch 152 is 1.1 or more, such as 2 or more, 5 or more, 10 or more, 20 or more, 100 or more, or 500 or more.

As illustrated in FIGS. 1A-1D, the capacitor 100 includes two external terminals 112, 114 on each surface and each internal electrode layer 1010 contains at least one lead tab extending from a top edge and a bottom edge. However, as indicated above, the present invention is not limited by the number of external terminals and/or the number of lead tabs extending from a top edge and/or bottom edge.

Figure 2A:
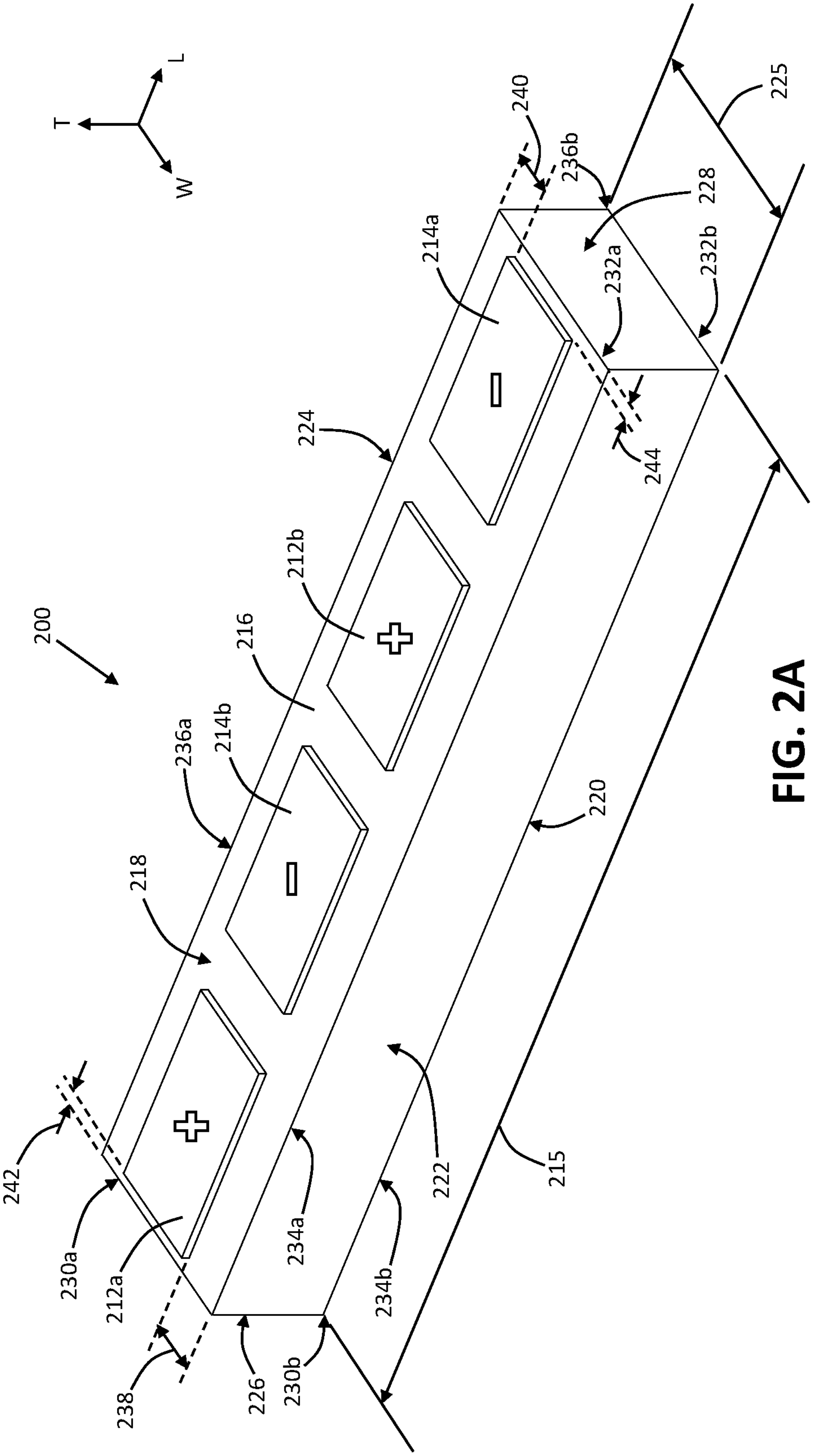
FIG. 2A illustrates a generally top and sides external perspective view of another embodiment of a capacitor including four external terminals in accordance with the present invention.

For instance, FIG. 2A illustrates a capacitor 200 containing four external terminals on each surface and two lead tabs extending from the top surface and the bottom surface of each internal electrode layers.

As illustrated in FIG. 2A, the capacitor 200 has a 1 by 4 configuration. That is, the capacitor 200 includes four external terminals arranged in a linear fashion in a single dimension on a top surface and a bottom surface of the capacitor. In the depicted embodiment, the capacitor 200 includes external terminals arranged in a linear fashion or a single row along a longitudinal direction L, which may be referred to as a linear terminal arrangement.

Figure 2B:
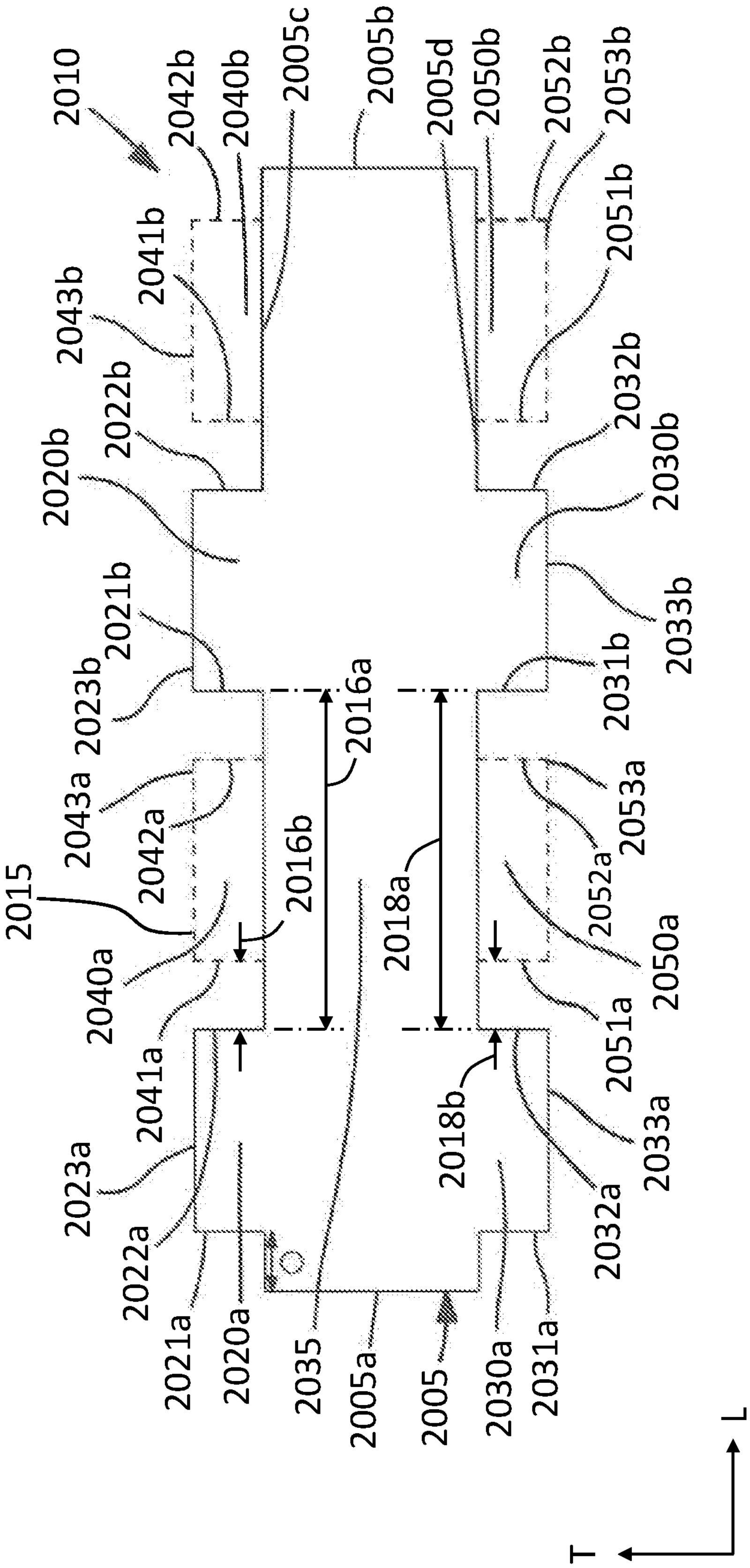
FIG. 2B illustrates a side view of the internal electrode layers of the capacitor of FIG. 2A.
Figure 2C:
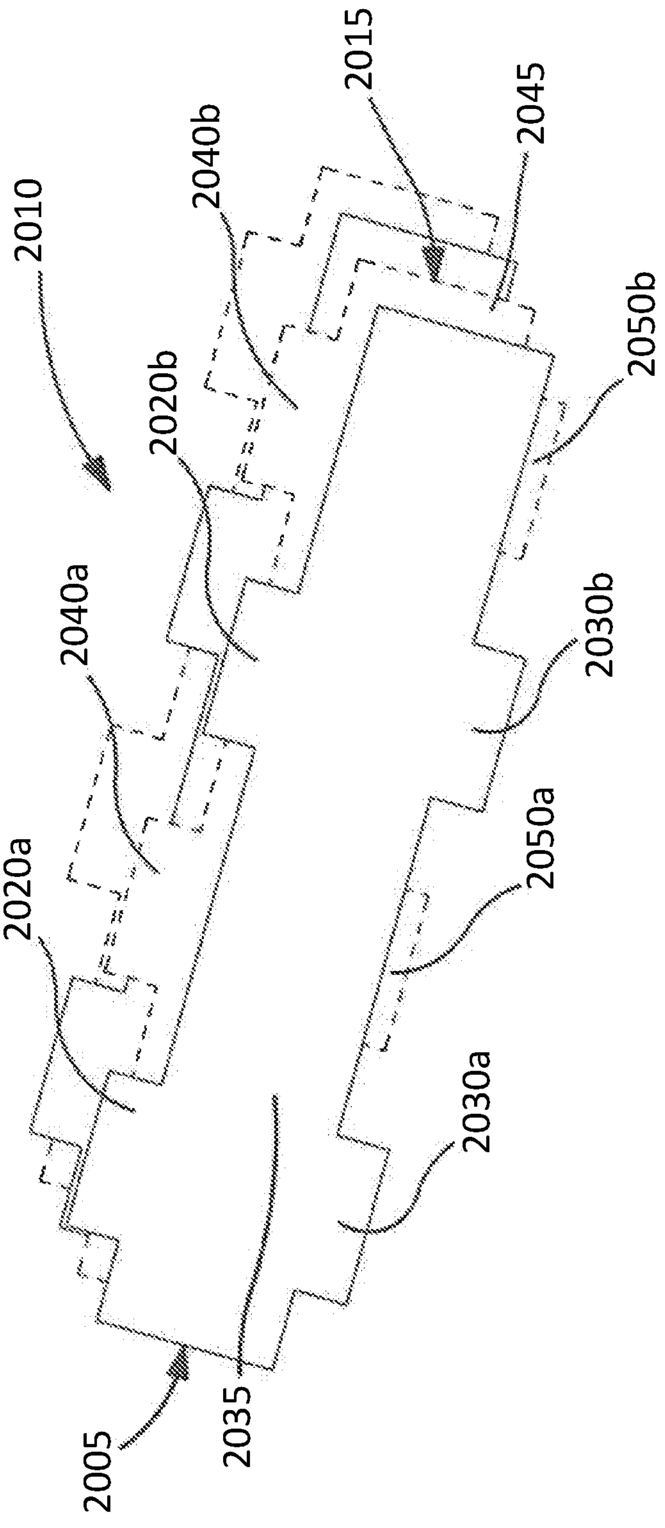
FIG. 2C illustrates a three-dimensional top and sides external perspective view of the internal electrode layers of the capacitor of FIGS. 2A and 2B.

In this regard, the capacitor 200 includes a body 216 having external terminals 212*a*, 212*b*, 214*a*, 214*b*, including a first external terminal 212*a* disposed on at least one of the top surface 218 or the bottom surface 220 and electrically connected to first internal electrode layers 2005 (FIGS. 2B, 2C) and a second external terminal 214*a* disposed on at least one of the top surface 218 or the bottom surface 220 and electrically connected to second internal electrode layers 2015 (FIGS. 2B, 2C). More particularly, in the depicted embodiment, the capacitor 200 includes a first external terminal 212*a*, a second external terminal 214*a*, a third external terminal 212*b*, and a fourth external terminal 214*b* disposed on the top surface 218 of the body 216 and four corresponding external terminals 212*a*, 212*b*, 214*a*, 214*b* (not shown) on the bottom surface 220 of the body 216, which may be referred to as a fifth external terminal 212*a*, sixth external terminal 214*a*, seventh external terminal 212*b*, and eighth external terminal 214*b*.

The external terminals 212*a*, 212*b*, 214*a*, 214*b* on the top surface 218 are electrically connected to the corresponding external terminals 212*a*, 212*b*, 214*a*, 214*b* on the bottom surface 220. As such, as shown in FIG. 2A, the capacitor 200 includes at least two first polarity terminals and at least two second and opposite polarity terminals on the top surface 218, and although not shown, the bottom surface 220 also includes at least two first polarity terminals and two second and opposite polarity terminals. Further, the first, third, fifth, and seventh external terminals 212*a*, 212*b* are electrically connected to first internal electrode layers 2005 (FIGS. 2B, 2C), and the second, fourth, sixth, and eighth external terminals 214*a*, 214*b* are electrically connected to second internal electrode layers 2015 (FIGS. 2B, 2C).

Similar reference numerals are used in FIGS. 2A-2D as in FIGS. 1A-1D. Generally, similar reference numerals in the figures refer to the same or similar features or components. Accordingly, it will be appreciated that the body 216 of the capacitor 200 is configured similarly to the body 116 of the capacitor 100. For example, the body 216 includes the top surface 218, the bottom surface 220 opposing the top surface 218 along a height direction T, a first side surface 222 extending between the top surface 218 and the bottom surface 220 along the height direction T, a second side surface 224 opposing the first side surface 222 along a lateral or width direction W and extending between the top surface 218 and the bottom surface 220, a first end surface 226 extending between the top surface 218 and the bottom surface 220 along the height direction T, and a second end surface 228 opposing the first end surface 226 along a longitudinal or length direction L and extending between the top surface 218 and the bottom surface 220. The body 216 has a body length 2015 and a body width 225.

Further, the top surface 218 has first and second end edges 230, 232 extending along the lateral direction W between the pair of side surfaces 222, 224. The top surface 218 also includes first and second side edges 234, 236 extending along the longitudinal direction L between the pair of end surfaces 226, 228. Although not shown in the figures, it will be appreciated that the bottom surface 220 may be configured similarly to the top surface 218, having first and second end edges and first and second side edges.

Figure 2D:
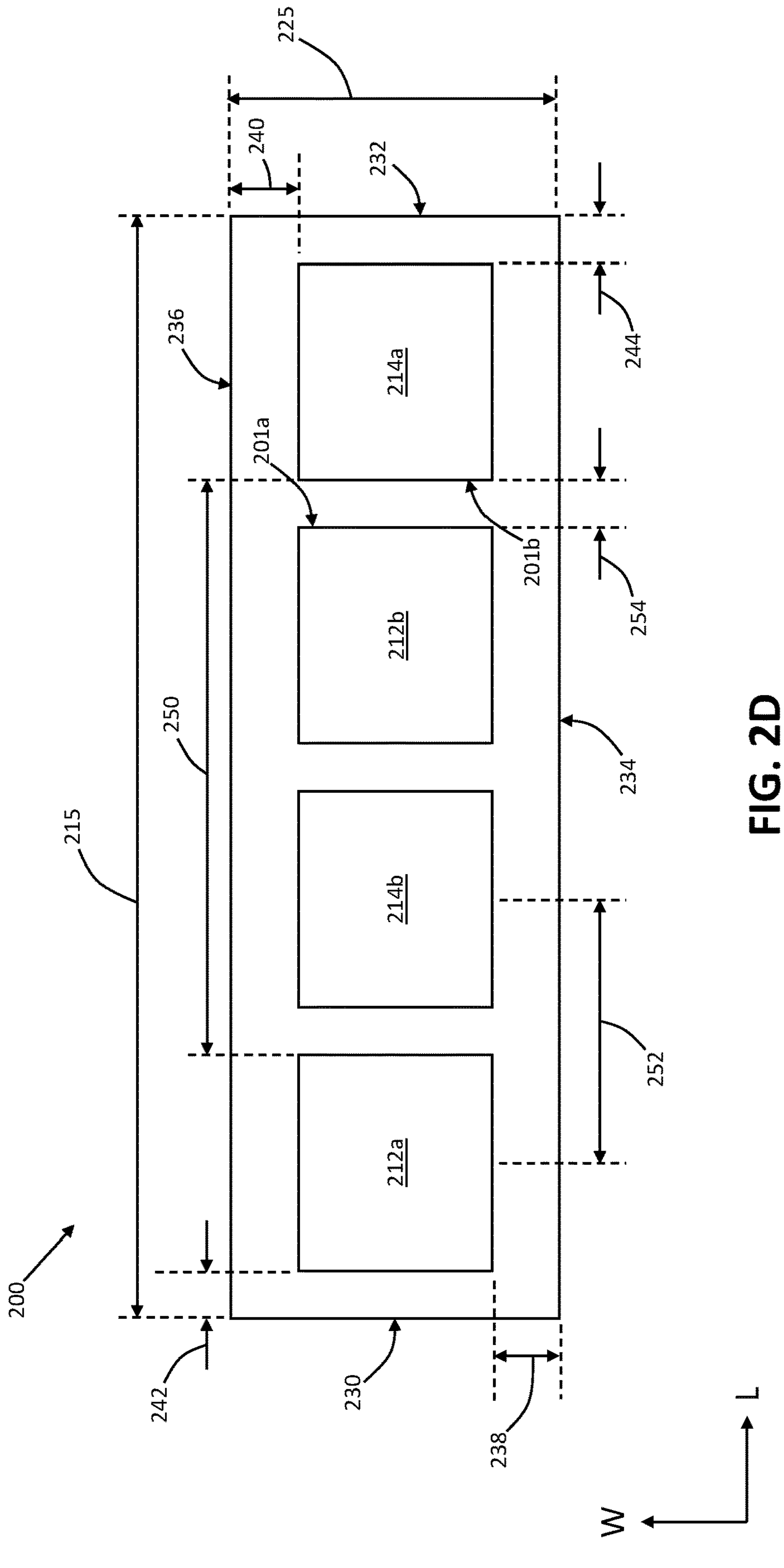
FIG. 2D illustrates a top external view of the capacitor of FIGS. 2A through 2C.

The external terminals 212, 214 of the capacitor 200 are offset from the sides and ends of the capacitor 200. As shown in FIGS. 2A and 2D, the external terminals 212*a*, 212*b*, 214*a*, 214*b* are spaced apart from each of the first side edge 234 and the second side edge 236 of both the top surface 218 and the bottom surface 220 such that only dielectric material is disposed between the external terminals 212*a*, 212*b*, 214*a*, 214*b* and the side edges 234, 236. For example, for each of the top surface 218 and the bottom surface 220, the external terminals 212*a*, 212*b*, 214*a*, 214*b* are spaced apart from each of the first side edge 234*a*, 234*b* and the second side edge 236*a*, 236*b* to define a first edge gap 238 between the external terminals 212*a*, 212*b*, 214*a*, 214*b* and the first side edge 234*a*, 234*b* and a second edge gap 240 between the external terminals 212*a*, 212*b*, 214*a*, 214*b* and the second side edge 236*a*, 236*b*. Similarly, the external terminals 212*a*, 214*b* are spaced apart from each of the first end edge 230*a*, 230*b* and the second end edge 232*a*, 232*b* of the top surface 218 and the bottom surface 220, respectively, to define a first end gap 242 between the external terminal 212*a* and the first end edge 230*a*, 230*b* and a second end gap 244 between the external terminal 214*b* and the second end edge 232*a*, 232*b*.

The edge gaps 238, 240 and the end gaps 242, 244 may be greater than the thickness of an individual layer, such as greater than an individual dielectric layer or an individual internal electrode layer 1010 (FIGS. 1B, 1C). For instance, each edge gap 238, 240 and each end gap 242, 244 may be at least two times, such as at least three times, such as at least five times, such as at least ten times the thickness of an individual dielectric layer or an individual internal electrode layer. In some embodiments, the first edge gap 238 and the second edge gap 240 may be the same (e.g., for a given surface 218, 220, the external electrodes 212*a*, 212*b*, 214*a*, 214*b* may be the same distance or equidistant from the respective first side edge 234*a*, 234*b* as the respective second side edge 236*a*, 236*b*), but in other embodiments, the first edge gap 238 and the second edge gap 240 may be different (e.g., for a given surface 218, 220, the external electrodes 212*a*, 212*b*, 214*a*, 214*b* may be closer to one of the first side edge 234 or the second side edge 236 than the other side edge of the respective surface 218, 220). Likewise, in some embodiments, the first end gap 242 and the second end gap 244 may be the same (e.g., for a given surface 218, 220, the external terminal 212*a* may be the same distance from the respective first end edge 230*a*, 230*b* as the external terminal 214*b* is from the respective second end edge 232*a*, 232*b*), but in other embodiments, the first end gap 242 and the second end gap 244 may be different (e.g., for a given surface 218, 220, one of the external terminals 212*a*, 214*b* may be closer to its adjacent end edge 230, 232 than the other external terminal 212*a*, 214*b* is to its adjacent end edge 230, 232).

The capacitor 200 of FIG. 2A includes external terminals 212*a*, 212*b*, 214*a*, 214*b* and a set of alternating dielectric layers and internal electrode layers 2010 as illustrated in FIG. 2B. As illustrated in FIG. 2B, the set of alternating dielectric layers and internal electrode layers 2010 includes internal electrode layers 2005, 2015 and dielectric layers (not shown) in an alternate arrangement.

In general, the internal electrode layers 2005, 2015 include at least one lead tab 2020*a*, 2020*b*, 2030*a*, 2030*b*, 2040*a*, 2040*b*, 2050*a*, 2050*b* extending from a top edge and a bottom edge of the main body of the internal electrode layers. In general, the lead tabs 2020*a*, 2020*b*, 2030*a*, 2030*b*, 2040*a*, 2040*b*, 2050*a*, 2050*b* of the internal electrode layers 2005, 2015 extend to the top surface and the bottom surface of the capacitor and assist in forming the external terminals. In this regard, the lead tabs 2020*a*, 2020*b*, 2030*a*, 2030*b*, 2040*a*, 2040*b*, 2050*a*, 2050*b* may be exposed on the top surface and the bottom surface of the capacitor and allow for connection between the main body of the internal electrode layers and the external terminals. For instance, lead tabs 2020*a*, 2020*b*, 2030*a*, 2030*b*, 2040*a*, 2040*b*, 2050*a*, 2050*b* may contain leading edges 2023*a-b*, 2033*a-b*, 2043*a-b*, 2053*a-b* that extend to an edge of a dielectric layer and allows for formation of the external terminals.

As illustrated in FIGS. 2B and 2C, the internal electrode layers 2005, 2015 include at least two lead tabs 2020*a*, 2020*b*, 2030*a*, 2030*b*, 2040*a*, 2040*b*, 2050*a*, 2050*b* along a top edge and a bottom edge. As illustrated in FIGS. 2B and 2C, a first internal electrode layer 2005 includes two lead tabs 2020*a*, 2020*b*, 2030*a*, 2030*b* along each top edge 2005*c* and bottom edge 2005*d* and extending from main body 235. A second internal electrode layer 2015 includes two lead tabs 2040*a*, 2040*b*, 2050*a*, 2050*b* along each top edge bottom edge and extending from main body 245.

The lead tabs 2020*a*, 2020*b*, 2030*a*, 2030*b* on the top edge 2005*c* and the bottom edge 2005*d* of first internal electrode layer 2005 may be aligned in the vertical direction. That is, a lateral edge 2021*a*, 2022*a* of a first lead tab 2020*a* along a top edge 2005*c* may be aligned with a lateral edge 231*a*, 232*a* of a first lead tab 2030*a* along a bottom edge 2005*d* opposite the top edge 2005*c*. In other words, a lateral edge 2021*a*, 2022*a* of a first lead tab 2020*a* along a top edge 2005*c* may be offset (indicated by "0") from a side edge 2005*a-b* the same distance as a lateral edge 231*a*, 232*a* of a first lead tab 2030*a* along a bottom edge 2005*d* opposite the top edge 2005*c*. Also, both lateral edges 2021*a*, 2022*a* of the first lead tab 2020*a* along a top edge 2005*c* may be aligned with the lateral edges 231*a*, 232*a* of a first lead tab 2030*a* along a bottom edge 2005*d* opposite the top edge 2005*c*. That is, both lateral edges may be offset from a side edge 2005*a-b* the same distance.

When a top edge 2005*c* and a bottom edge 2005*d* contain at least two lead tabs 2020*a*, 2020*b*, 2030*a*, 2030*b*, at least one lateral edge of each lead tab on a top edge 2005*c* may be aligned with a corresponding lateral edge of a lead tab on the bottom edge 2005*d*. Also, both lateral edges of each lead tab on a top edge 2005*c* may be aligned with corresponding lateral edges of the lead tabs on the bottom edge 2005*d*.

Similarly, the lead tabs 2040*a*, 2040*b*, 2050*a*, 2050*b* on the top edge and the bottom edge of second internal electrode layer 2015 may be aligned in the vertical direction. That is, a lateral edge 2041*a*, 2042*a* of a first lead tab 2040*a* along a top edge may be aligned with a lateral edge 2051*a*, 2052*a* of a first lead tab 2050*a* along a bottom edge opposite the top edge. Both lateral edges 2041*a*, 2042*a* of the first lead tab 2040*a* along a top edge may be aligned with the lateral edges 2051*a*, 2052*a* of a first lead tab 2050*a* along a bottom edge opposite the top edge. The relationship between lateral edges of a first lead tab on a top edge and a first lead tab on a bottom edge as mentioned with respect to internal electrode layer 2005 may also apply to internal electrode layer 2015.

With such arrangement, a tab gap may be formed between any of the lead tabs along a top edge 2005*c* of first internal electrode layer 2005, of second internal electrode layer 2015, or both. For instance, a tab gap may be formed between any of lead tabs 2020*a-b*, 2040*a-b* that extend from the top edges of the respective internal electrode layers. Additionally, a tab gap may be formed between any of the lead tabs along a bottom edge 2005*d* of first internal electrode layer 2005, of second internal electrode layer 2015, or both. For instance, a tab gap may be formed between any of lead tabs 2030*a-b*, 2050*a-b* that extend from the bottom edges of the respective internal electrode layers. Also, the size of a tab gap between two respective tabs that extend from a top edge, whether from the same internal electrode layer or adjacent internal electrode layers, may be substantially the same as the size of a tab gap between the corresponding two respective tabs that extend from a bottom edge. For example, a first tab gap 2016*a* between lead tabs 2020*a* and 2020*b* may be substantially the same as a first tab gap 2018*a* between lead tabs 2030*a* and 2030*b*. Similarly, a second tab gap 2016*b* between lead tabs 2020*a* and 2040*a* may be substantially the same as a second tab gap 2018*b* between lead tabs 2030*a* and 2050*a*.

Any or all of lead tabs 2020*a*, 2020*b*, 2040*a*, 2040*b* may be arranged in parallel with lead tabs 2030*a*, 2030*b*, 2050*a*, 2050*b*, respectively, extending from the layers 2005 and 2015 such that the lead extending from alternating electrode layers 2005 and 2015 may be aligned in a respective column. For instance, lead tabs 2020*a*, 2020*b* and 2030*a*, 2030*b* of internal electrode layer 2005 may be arranged in a respective stacked configuration while lead tabs 2040*a*, 2040*b* and 2050*a*, 2050*b* of internal electrode layer 2015 may be arranged in a respective stacked configuration.

It will be appreciated that lead tabs 2020*a*, 2020*b* connect to external terminals 22*a-b*, respectively, while lead tabs 2040*a*, 2040*b* connect to external terminal 24*a-b*, respectively. Accordingly, respective lead tabs 2020*a*, 2020*b* will be interdigitated with respective lead tabs 2040*a*, 2040*b*, respectively, in a manner similar to external terminals 22*a-b* and 24*a-b*. The interdigitated lead tabs can provide multiple, adjacent current injection points onto the associated main electrode portions.

As depicted in FIG. 2D, the external terminals 212*a*, 212*b*, 214*a*, 214*b* may be spaced apart from each other, as well as the sides and ends of the top surface 218 and bottom surface 220 of the capacitor 200. The external terminals 212*a*, 212*b*, 214*a*, 214*b* may include a first end external terminal 212*a* disposed adjacent the first end surface 226 and first end edge 230 and a second end external terminal 214*a* disposed adjacent the second end surface 228 and second end edge 232. The first end external terminal 212*a* and the second end external terminal 214*a* are spaced apart in the longitudinal direction L by an end external terminal spacing distance 250.

As previously described, the body 216 has a body length 215 in the longitudinal direction L. A ratio of the body length 215 to the end external terminal spacing distance 250 is 1.1 or more, such as 2 or more, 5 or more, 10 or more, 20 or more, 100 or more, or 500 or more.

As further illustrated in FIG. 2D, a pitch 252 is defined between adjacent external terminals 212*a*, 212*b*, 214*a*, 214*b*, such as between adjacent terminals 212*a* and 214*b*, between adjacent terminals 214*b* and 212*b*, or between adjacent terminals 212*b* and 214*a*. As previously described, the pitch 252 is the nominal distance between the centers of adjacent external terminals; the pitch 252 also may be referred to as center-to-center spacing of the external terminals. A ratio of the body length 215 to the pitch 252 is 1.1 or more, such as 2 or more, 5 or more, 10 or more, 20 or more, 100 or more, or 500 or more.

The adjacent external terminals 212*a*, 212*b*, 214*a*, 214*b* are also spaced apart from one another in the longitudinal direction L on the top surface 228 by an adjacent external terminal spacing distance 254 between adjacent lateral sides of the external terminals. For example, as shown in FIG. 2D, a first lateral side 201*a* of the external terminal 212*b* (the first lateral side 201*a* facing the external terminal 214*a*) is spaced apart from a first lateral side 201*b* of the external terminal 214*a* (the first lateral side 201*b* facing the external terminal 212*b*) by the adjacent external terminal spacing distance 254. A ratio of the body length 215 to the adjacent external terminal spacing distance 254 is 1.1 or more, such as 2 or more, 5 or more, 10 or more, 20 or more, 100 or more, or 500 or more.

Additionally, as shown in FIG. 2A, the capacitor 200 of FIGS. 2A through 2D includes at least one first polarity terminal and at least one second and opposite polarity terminal on a top surface. Although not shown, the bottom surface includes at least a first polarity terminal and a second and opposite terminal. In particular, FIG. 2A includes two positive terminals 212*a-b* and two negative terminals 214*a-b* on a top surface.

As illustrated in FIGS. 2A-2D, the capacitor contains four external terminals on each surface and each internal electrode layer of the capacitor contains two lead tabs extending from each of the top and bottom edges of the internal electrode layer. However, as indicated above, the present invention is not limited by the number of external terminals and/or the number of lead tabs of the internal electrode layers.

Figure 3A:
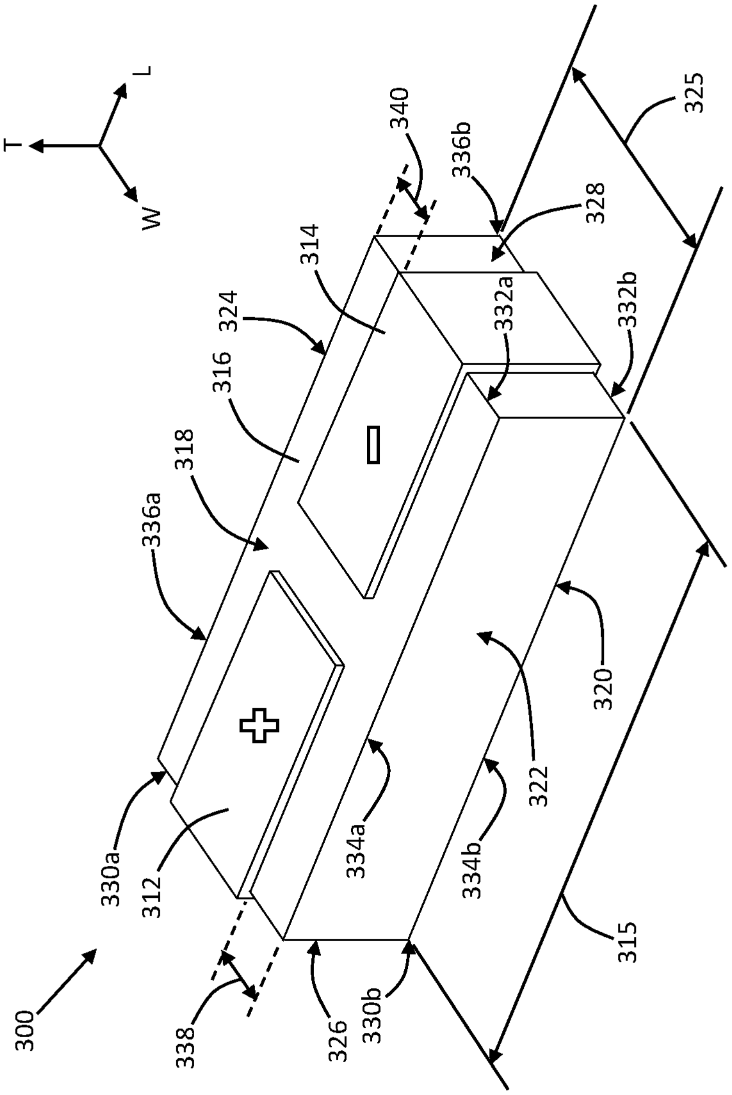
FIG. 3A illustrates a generally top and sides external perspective view of one embodiment of a capacitor including two external terminals in accordance with the present invention.
Figure 3B:
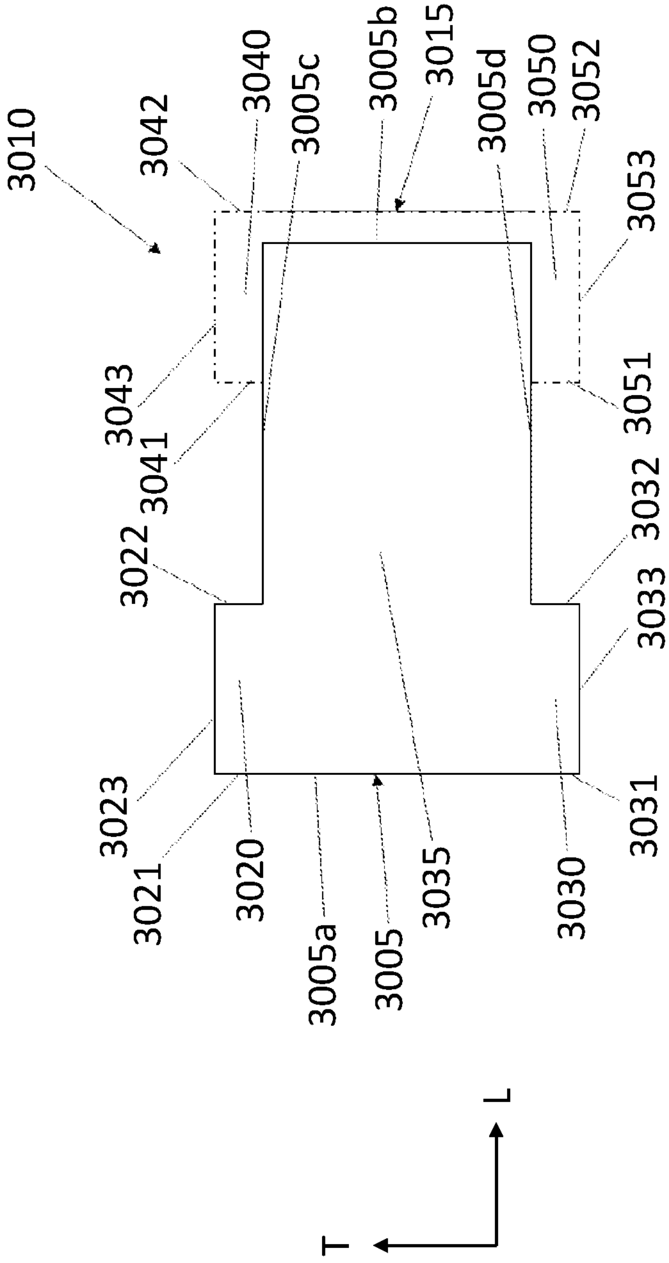
FIG. 3B illustrates a side view of the internal electrode layers of the capacitor of FIG. 3A.
Figure 3C:
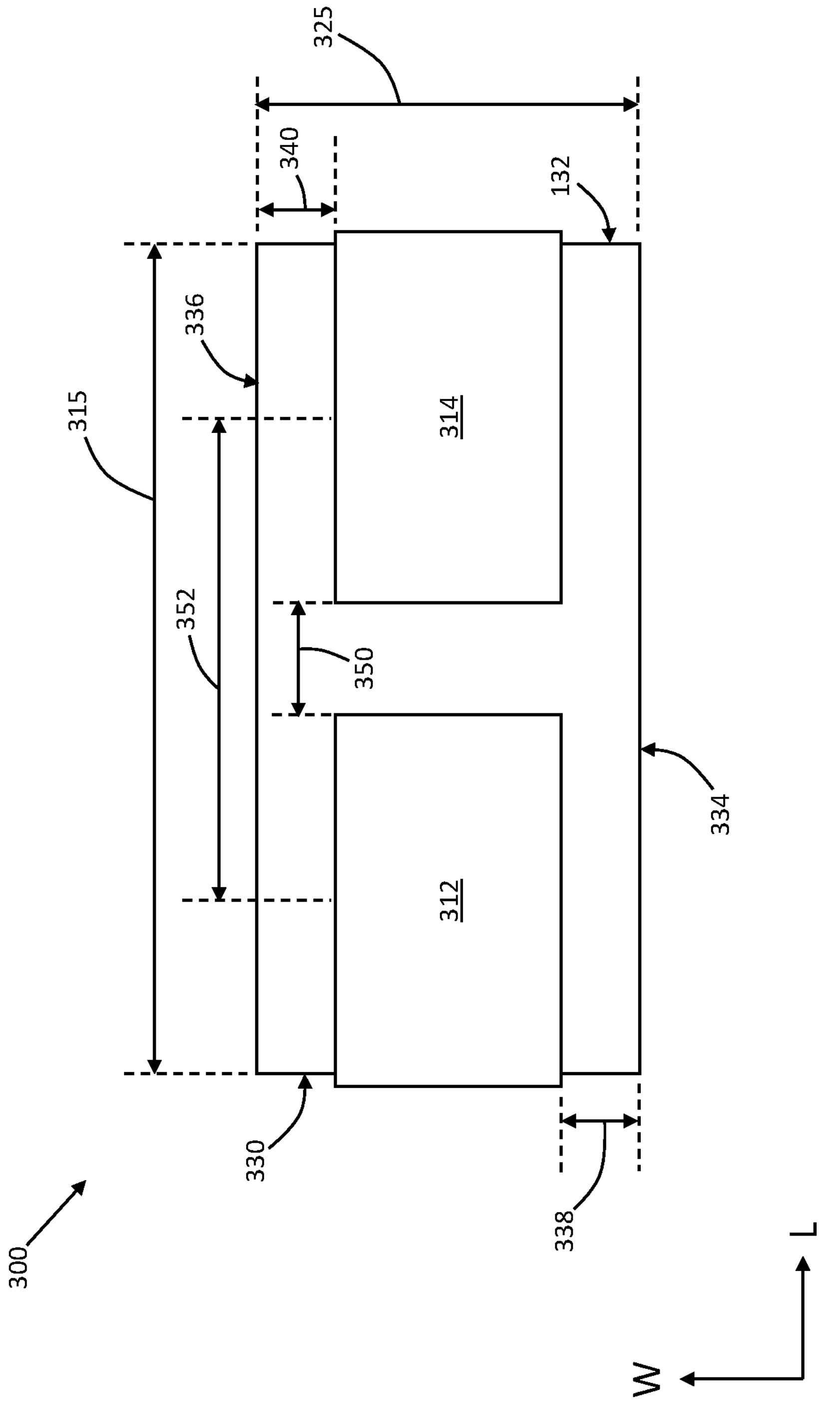
FIG. 3C illustrates a top external view of the capacitor of FIGS. 3A and 3B.

Turning now to FIGS. 3A through 3C, a capacitor 300 is illustrated having a 1 by 2 configuration. That is, the capacitor 300 includes two external terminals arranged in a linear fashion in a single dimension on a top surface and a bottom surface of the capacitor. In the depicted embodiment, the capacitor 300 includes external terminals arranged in a linear fashion or a single row along a longitudinal direction L, which may be referred to as a linear terminal arrangement.

In this regard, the capacitor 300 includes a body 316 having external terminals 312, 314, including a first external terminal 312 disposed on at least one of the top surface 318 or the bottom surface 320 and electrically connected to first internal electrode layers 3005 (FIGS. 3B, 3C) and a second external terminal 314 disposed on at least one of the top surface 318 or the bottom surface 320 and electrically connected to second internal electrode layers 3015 (FIGS. 3B, 3C).

It will be appreciated that the capacitor 300 illustrated in FIGS. 3A-3C is largely similar to the capacitor 100 of FIGS. 1A-1D, and similar reference numbers are used in FIGS. 3A-3C as in FIGS. 1A-1D to denote the same or similar features. However, unlike the external terminals 112, 114 of the capacitor 100, the external terminals 312, 314 of the capacitor 300 are not spaced apart from the end surfaces 326, 328 of the capacitor body 316. Instead, the external terminal 312 is formed along a first end of the body 316 from the top surface 318 to the bottom surface 320 such that a portion of the external terminal 312 extends along the first end surface 326. Similarly, the external terminal 314 is formed along a second end of the body 316 from the top surface 318 to the bottom surface 320 such that a portion of the external terminal 314 extends along the second end surface 328. Accordingly, rather than external terminals that are separately formed on the top and bottom surfaces as shown in FIGS. 1A and 1D, the first external electrode 312 wraps from the top surface 318 to the bottom surface 320 such that the first external electrode 312 is disposed on the top surface 318, first end surface 326, and bottom surface 320, and the second external electrode 314 wraps from the top surface 318 to the bottom surface 320 such that the second external electrode 314 is disposed on the top surface 318, second end surface 328, and bottom surface 320.

Further, unlike the lead tabs 1020, 1030, 1040, 1050 of electrode layers 1005, 1015 that are offset from the side edge **100*a* (as indicated by "0" in FIG. 1B), the lead tabs 3020, 3030, 3040, 3050 of electrode layers 3005, 3015 are not offset from the side edge 3005*a*. As such, the lateral edges 3021, 3031, 3042, 3052 of the lead tabs 3020, 3030, 3040, 3050 and the side edges 3005*a* of the electrode layers 3005, 3015 extend to the ends 326, 328 of the capacitor body 316 and can assist in the formation of the external electrodes 312, 314, e.g., along the end surfaces 326, 328**.

Additionally, the embodiments of the figures employ only two internal electrode layers in the stack of alternating dielectric layers and internal electrode layers. However, it should be understood that the present invention may include any number of internal electrode layers as indicated herein and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 50 μm or less, such as about 40 μm or less, such as about 30 μm or less, such as about 25 μm or less, such as about 20 μm or less to about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the internal electrode layers that is exposed from the body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized and thus are not necessarily limited.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed as desired or necessary. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. Further, the materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Alternatively, another plating layer, such as the second plating layer, may comprise cooper or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel or copper) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, the formation of terminations by plating, magnetism, masking, electrophoretics/electrostatics, sputtering, vacuum deposition, printing or other techniques for forming both thick-film conductive layers or thin-film conductive layers.

Further, the capacitor may then be subjected to a solder mask. For instance, this can allow the capacitor to be coated. Without intending to be limited, such mask may assist in prevention of oxidation of the plated layers, such as the copper plated layer, in particular when such layer is the final plating layer of the external terminal. Such solder mask material may not necessarily be limited by the present invention. For instance, such material may include any of those mentioned above with respect to the solder barrier layer. In addition to or alternatively, such material may include an epoxy, such as a liquid epoxy which is then cured.

When providing such material on the capacitor, it may be required to access the plating layer and external terminal in order to form an electrical connection. In this regard, a laser may be utilized to form a hole through the mask layer. Such hole may then be filled with a conductive material, such as copper. This can then be utilized to form an electrical connection with the capacitor.

Figure 4:
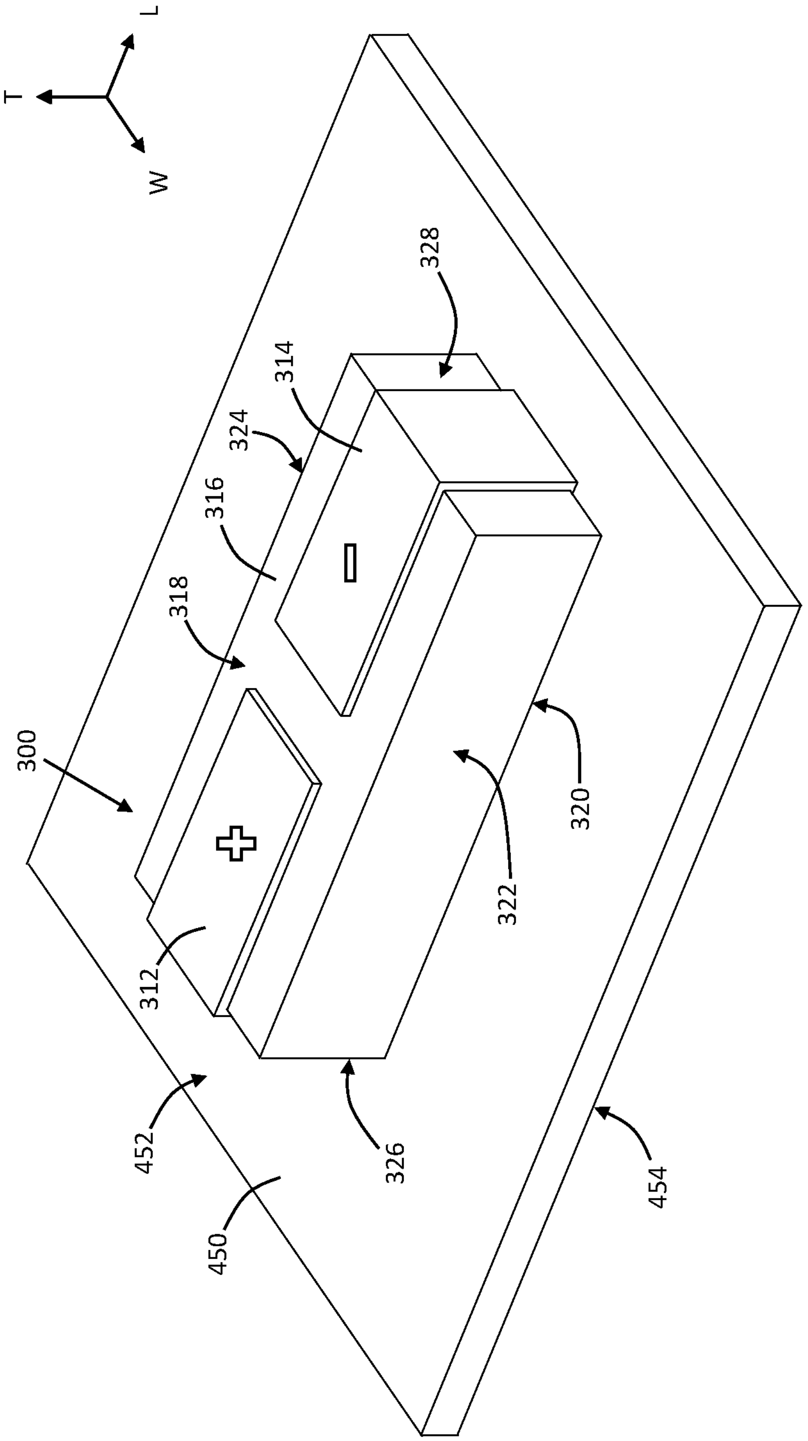
FIG. 4 illustrates a perspective view of the capacitor of FIG. 3A mounted on a mounting surface in accordance with the present invention.
Figure 5:
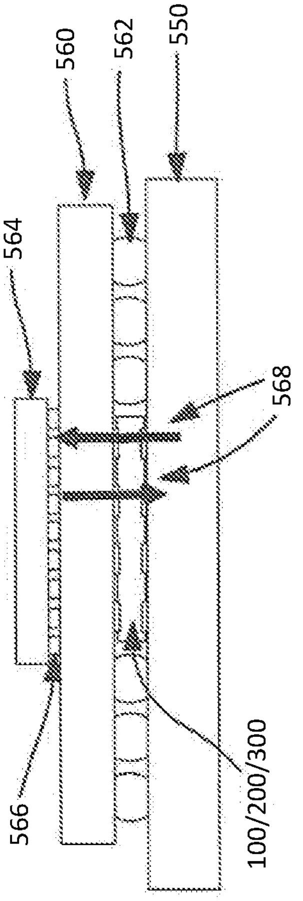
FIG. 5 illustrates a side view of a printed circuit board and integrated circuit package containing a capacitor in accordance with the present invention.

Turning to FIGS. 4 and 5, the capacitor as disclosed herein can be mounted using various means. For instance, the capacitor can be mounted onto a circuit board that contains a substrate (e.g., insulating layer) having an upper surface and a lower surface. Referring to FIG. 4, a capacitor 300 such as shown in FIG. 3A is mounted onto a circuit board 450 having an upper surface 452 and a lower surface 454. The circuit board 450 has a plurality of electrical current paths defined therein. The external terminals 312, 314 of the capacitor 300 are in respective electrical communication with the predetermined current paths of the circuit board 450. In addition, the external terminals 312, 314 of the capacitor 300 can be physically connected to the circuit board 450 using any method generally known in the art, such as general soldering techniques. It will be appreciated that the capacitor 300 is used by way of example only; in other embodiments, the capacitor 100 and/or the capacitor 200 can be mounted to a mounting surface such as circuit board 450.

As illustrated in FIG. 5, an integrated circuit package 560 may also be provided on a circuit board 550. The integrated circuit package 560 may be connected to the circuit board 550 using a ball grid array 562. The circuit board may further comprise a processor 564. The processor 564 may be connected to the integrated circuit package 560 also using a ball grid array 566.

In general, the ball grid array 562 may be configured such that the pitch is 1.5 mm or less, such as 1.25 mm or less, such as 1 mm or less, such as 0.8 mm or less, such as 0.6 mm or less and 0.4 mm or more, such as 0.5 mm or more, such as 0.6 mm or more.

In addition, the integrated circuit package 560 may also be connected to the circuit board 550 using a capacitor as defined herein. In this regard, the internal electrode layers of the capacitor 100/200/300 may be positioned such that they are orthogonal to a horizontal plane of the circuit board 550 and integrated circuit package 560. In other words, the internal electrode layers of the capacitor 100/200/300 may be positioned such that they are substantially nonparallel with the circuit board 550. For instance, the capacitor 100/200/300 may be positioned between the integrated circuit package 560 and the circuit board 550 such that the capacitor 100/200/300 is "sandwiched" between the two components. In this regard, the capacitor 100/200/300 is directly connected to the integrated circuit package 560 and the circuit board 550. For instance, the capacitor 100/200/

300 can be connected (e.g., physically and/or electrically) to the circuit board 550 and/or circuit package 560 using any method generally known in the art, such as general soldering techniques.

By employing the capacitor in the aforementioned arrangement, the capacitor 100/200/300 may allow for removal of some of the original ball grid array 562. However, the capacitor 100/200/300 may still be surrounded by a ball grid array 562 as illustrated in FIG. 5.

Thus, as shown in FIG. 5, the capacitor 100/200/300 of the present invention can be directly connected to an integrated circuit package 560 and a circuit board 550, such as a printed circuit board. This direct connection allows for current 568 to flow through the capacitor thereby providing a direct power ground connection.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

While the aforementioned provides one example of a means for mounting the capacitor as disclosed herein, it should be understood that other methods may also be utilized. For instance, the capacitor may be mounted via land grid array configuration. The capacitor may also be embedded in another substrate or component.

In the embodiments referenced above, the internal electrode layers are generally oriented in a vertical configuration. Of course, this is by no means required and it is equally suitable to use other geometric configurations, such as a horizontal configuration.

These and other modifications and variations of the present invention may be practiced by those of ordinary skill in the art, without departing from the spirit and scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

The invention claimed is:

1. A multilayer capacitor comprising:

a body having a top surface, a bottom surface opposing the top surface, a pair of side surfaces opposing one another along a lateral direction, and a pair of end surfaces opposing one another along a longitudinal direction, the body also having side edges defining lateral boundaries of the top and bottom surfaces and including a first top side edge, a second top side edge, a first bottom side edge, and a second bottom side edge each extending along the longitudinal direction between the pair of end surfaces, the first top side edge and the second top side edge opposing each other along the lateral direction, the first bottom side edge and the second bottom side edge opposing each other along the lateral direction, the body containing alternating dielectric layers and internal electrode layers, the internal electrode layers including first internal electrode layers and second internal electrode layers, each internal electrode layer including:

a main body having a top edge, a bottom edge opposite the top edge, and two side edges extending between the top edge and the bottom edge, at least one top lead tab extending from the top edge of the main body of the internal electrode layer and at least one bottom lead tab extending from the bottom edge of the main body of the internal electrode layer; and external terminals including a first external terminal disposed on at least one of the top surface or the bottom surface and electrically connected to the first internal electrode layers and a second external terminal disposed on at least one of the top surface or the bottom surface and electrically connected to the second internal electrode layers, each external terminal having two sides extending parallel and adjacent to the side edges of the body, wherein the external terminals are arranged in a linear fashion in a single row on at least one of the top surface or the bottom surface of the body and are spaced apart from the side edges of the body such that only dielectric material is disposed between the two sides of each external terminal and the side edges of the body, wherein the external terminals are spaced apart from the first top side edge and the first bottom side edge to define a first edge gap and the external terminals are spaced apart from the second top side edge and the second bottom side edge to define a second edge gap, and wherein each of the first edge gap and the second edge gap is at least five times the thickness of an individual dielectric layer or an individual internal electrode layer.

2. The multilayer capacitor of claim 1, wherein the first external terminal is disposed adjacent a first end surface of the pair of end surfaces of the body and the second external terminal is disposed adjacent a second end surface of the pair of end surfaces of the body, wherein the first external terminal and the second external terminal are spaced apart in the longitudinal direction on the top surface by an end external terminal spacing distance, wherein the body has a body length in the longitudinal direction, and wherein a ratio of the body length to the end external terminal spacing distance is 1.1 or more.

3. The multilayer capacitor of claim 2, wherein the ratio of the body length to the end external terminal spacing distance is within a range of 2 to 500.

4. The multilayer capacitor of claim 3, wherein:

the external terminals include adjacent terminals spaced apart from one another in the longitudinal direction on the top surface by an adjacent external terminal spacing distance and a pitch is defined between adjacent external terminals, a ratio of the body length to the adjacent external terminal spacing distance is within a range of 2 to 500, a ratio of the end external terminal spacing distance to the adjacent external terminal spacing distance is within a range of 2 to 500, and a ratio of the body length to the pitch is within a range of 2 to 500.

5. The multilayer capacitor of claim 2, wherein the ratio of the body length to the end external terminal spacing distance is within a range of 10 to 100.

6. The multilayer capacitor of claim 2, wherein the external terminals include an adjacent terminal adjacent the first external terminal on a same surface of the body, wherein the first external terminal and the adjacent terminal are spaced apart from one another in the longitudinal direction on the same surface by an adjacent external terminal spacing distance, and wherein a ratio of the end external terminal spacing distance to the adjacent external terminal spacing distance is 1.1 or more.

7. The multilayer capacitor of claim 6, wherein the ratio of the end external terminal spacing distance to the adjacent external terminal spacing distance is within a range of 10 to 100.

8. The multilayer capacitor of claim 1, wherein a first lateral edge of the at least one top lead tab and a first lateral edge of the at least one bottom lead tab are aligned with a first side edge of the two side edges of the main body of each internal electrode layer, wherein the first external terminal is disposed adjacent a first end surface of the pair of end surfaces of the body and the second external terminal is disposed adjacent a second end surface of the pair of end surfaces of the body, wherein the first external terminal is formed on the top surface, the bottom surface, and the first end surface from the top surface to the bottom surface such that the first external terminal is disposed on the top surface, the bottom surface, and the first end surface, and wherein the second external terminal is formed on the top surface, the bottom surface, and the second end surface from the top surface to the bottom surface such that the second external terminal is disposed on the top surface, the bottom surface, and the second end surface.

9. The multilayer capacitor of claim 1, wherein the external terminals are arranged in at least two columns, the at least two columns spaced apart from one another along the longitudinal direction.

10. The multilayer capacitor of claim 9, wherein the number of columns of external terminals equals a number of lead tabs extending from the top edge of the main body of a respective one internal electrode layer.

11. The multilayer capacitor of claim 1, wherein the body has end edges defining longitudinal boundaries of the top and bottom surfaces and including a first top end edge, a second top end edge, a first bottom end edge, and a second bottom end edge each extending along the lateral direction between the pair of side surfaces, the first top end edge and the second top end edge opposing each other along the longitudinal direction, the first bottom end edge and the second bottom end edge opposing each other along the longitudinal direction, and wherein the external terminals are spaced apart from the end edges of the body such that only dielectric material is disposed between the external terminals and the end edges of the body.

12. The multilayer capacitor of claim 1, wherein the external terminals include adjacent terminals spaced apart from one another in the longitudinal direction on the top surface by an adjacent external terminal spacing distance, wherein the body has a body length in the longitudinal direction, and wherein a ratio of the body length to the adjacent external terminal spacing distance is 1.1 or more.

13. The multilayer capacitor of claim 12, wherein the ratio of the body length to the adjacent external terminal spacing distance is within a range of 10 to 100.

14. The multilayer capacitor of claim 1, wherein a pitch is defined between adjacent external terminals, wherein the body has a body length in the longitudinal direction, and wherein a ratio of the body length to the pitch is 1.1 or more.

15. The multilayer capacitor of claim 14, wherein the ratio of the body length to the pitch is within a range of 2 to 500.

16. The multilayer capacitor of claim 14, wherein the ratio of the body length to the pitch is within a range of 10 to 100.

17. The multilayer capacitor of claim 1, wherein the first external terminal is disposed on the top surface of the body and the second external terminal is disposed on the top surface of the body, and wherein the external terminals further comprise a third external terminal disposed on the bottom surface and electrically connected to the first internal electrode layers and a fourth external terminal disposed on the bottom surface and electrically connected to the second internal electrode layers.

18. The multilayer capacitor of claim 1, wherein the first internal electrode layers and the second internal electrode layers are interleaved in an opposed relation and a dielectric layer is positioned between each first internal electrode layer and second internal electrode layer.

19. The multilayer capacitor of claim 18, wherein the dielectric layers comprise a ceramic.

20. The multilayer capacitor of claim 1, wherein each internal electrode layer includes at least two lead tabs, the at least two lead tabs extending from the top edge of the main body, the bottom edge of the main body, or both the top edge and the bottom edge of the main body, the two lead tabs including a first lead tab and a second lead tab.

21. The multilayer capacitor of claim 20, wherein the first lead tab extends from the top edge and the second lead tab extends from the bottom edge, and wherein at least one lateral edge of the first lead tab is substantially aligned with at least one lateral edge of the second lead tab.

22. The multilayer capacitor of claim 20, wherein the first lead tab extends from the top edge and the second lead tab extends from the bottom edge, wherein each of the first lead tab and the second lead tab include two lateral edges, and wherein both lateral edges of the first lead tab are substantially aligned with respective lateral edges of the second lead tab.

23. The multilayer capacitor of claim 1, wherein at least one lateral edge of the lead tab on the top edge is substantially aligned with at least one lateral edge of the lead tab on the bottom edge.

24. The multilayer capacitor of claim 1, wherein both lateral edges of the lead tab on the top edge are substantially aligned with respective lateral edges of the lead tab on the bottom edge.

25. The multilayer capacitor of claim 1, wherein the at least one top lead tab extending from the top edge of the main body of the internal electrode layer and the at least one bottom lead tab extending from the bottom edge of the main body of the internal electrode layer includes a lateral edge aligned with a side edge of the main body of the internal electrode layer.

26. The multilayer capacitor of claim 1, wherein the internal electrode layers comprise a conductive metal.

27. The multilayer capacitor of claim 1, wherein the external terminals include an electroplated layer.

28. The multilayer capacitor of claim 1, wherein the external terminals include an electroless plated layer.

29. The multilayer capacitor of claim 1, wherein the external terminals include an electroless plated layer and an electroplated layer.

30. The multilayer capacitor of claim 1, wherein the external terminals include a first electroless plated layer, a second electroplated layer, and a third electroplated layer.

31. The multilayer capacitor of claim 30, wherein the first electroless plated layer includes copper, the second electroplated layer includes nickel, and the third electroplated layer includes tin.

32. The multilayer capacitor of claim 1, wherein the capacitor includes at least three sets of alternating dielectric layers and internal electrode layers.

33. A circuit board including the multilayer capacitor of claim 1 positioned on the circuit board.

34. The circuit board of claim 33, wherein the board further comprises an integrated circuit package and wherein the multilayer capacitor is positioned between the circuit board and the integrated circuit package in a vertical direction such that the circuit board, the multilayer capacitor, and the integrated circuit package are present in a stacked arrangement.

35. The circuit board of claim 34, wherein the multilayer capacitor is directly connected to the circuit board and the integrated circuit package.

36. An integrated circuit package containing the multilayer capacitor of claim 1.

* * * * *